US010254326B1

(12) United States Patent
Heike Spieler Canne et al.

(10) Patent No.: US 10,254,326 B1
(45) Date of Patent: *Apr. 9, 2019

(54) AUTOMATED ANALYSIS OF RF EFFECTS ON ELECTRONIC DEVICES THROUGH THE USE OF DEVICE UNINTENDED EMISSIONS

(71) Applicant: NOKOMIS, INC., Charleroi, PA (US)

(72) Inventors: Karen Heike Spieler Canne, South Park, PA (US); Walter John Keller, Bridgeville, PA (US); Todd Eric Chornenky, Carmichaels, PA (US)

(73) Assignee: NOKOMIS, INC., Charleroi, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/712,240

(22) Filed: Sep. 22, 2017

Related U.S. Application Data

(63) Continuation of application No. 14/632,471, filed on Feb. 26, 2015, now Pat. No. 9,772,363.
(Continued)

(51) Int. Cl.
*H04B 17/00* (2015.01)
*H04W 24/00* (2009.01)
(Continued)

(52) U.S. Cl.
CPC ....... *G01R 31/002* (2013.01); *G01R 29/0814* (2013.01); *H04B 17/00* (2013.01); *H04W 24/00* (2013.01)

(58) Field of Classification Search
CPC ...... H04B 17/00; H04B 17/085; H04B 17/15; H04B 17/18; H04B 17/26; H04B 17/29;
(Continued)

(56) References Cited

U.S. PATENT DOCUMENTS

| 5,218,294 A | 6/1993 | Soiferman |
| 5,227,800 A | 7/1993 | Huguenin et al. |

(Continued)

FOREIGN PATENT DOCUMENTS

| JP | 06011530 | 1/1994 |
| JP | 2000076387 | 3/2000 |

(Continued)

OTHER PUBLICATIONS

William E. Cobb, et al., Intrinsic Physical-Layer Authentication of Integrated Circuits, Leee Transactions on Information Forensics and Security, vol. 7, No. 1, Feb. 2012.
(Continued)

*Primary Examiner* — Philip Sobutka
(74) *Attorney, Agent, or Firm* — AP Patents

(57) ABSTRACT

An apparatus, configured and operable to determine a state and/or an operation of a powered electrical device, comprises one or more antennas, a receiver operable to receive emission(s) of electromagnetic energy from the electrical device; an illumination device operable to illuminate the electrical device with a pulse of electromagnetic energy; a controller including: one or more processors, a non-transitory computer readable medium comprising executable instructions that, when executed by the one or more processors, cause the one or more processors to perform the steps of selecting a spectral frequency target component of the emission(s), iteratively controlling the illumination device, measuring, at each iteration, a change in characteristic(s) of the spectral frequency target component of the emission(s), assigning a score value to each measurement, and iteratively effecting optimized parameter(s) of the pulse based on the score value until a final score value indicates a desired state, operation of the electrical device.

27 Claims, 11 Drawing Sheets

Related U.S. Application Data

(60) Provisional application No. 61/966,559, filed on Feb. 26, 2014.

(51) Int. Cl.
  *G01R 31/00* (2006.01)
  *G01R 29/08* (2006.01)

(58) Field of Classification Search
  CPC .... H04B 17/30; H04B 17/309; H04B 17/373; H04B 17/391; H04B 17/3912; H04B 17/3913; H04W 24/00; H04W 24/06; H04W 24/08
  USPC .................................. 455/67.11–67.16, 423
  See application file for complete search history.

(56) References Cited

U.S. PATENT DOCUMENTS

| | | | |
|---|---|---|---|
| 5,302,830 A | 4/1994 | Shivanandan | |
| 5,424,633 A | 6/1995 | Soiferman | |
| 5,517,110 A | 5/1996 | Soiferman | |
| 5,668,342 A | 9/1997 | Discher | |
| 5,714,888 A | 2/1998 | Naujoks | |
| 6,049,301 A | 4/2000 | Weagant | |
| 6,057,765 A | 5/2000 | Jones et al. | |
| 6,163,259 A | 12/2000 | Barsumian et al. | |
| 6,496,703 B1 | 12/2002 | da Silva | |
| 6,720,905 B2 | 3/2004 | Levitan et al. | |
| 6,759,863 B2 | 7/2004 | Moore | |
| 6,765,527 B2 | 7/2004 | Jablonski et al. | |
| 6,825,456 B2 | 11/2004 | Chadwick et al. | |
| 6,897,777 B2 | 5/2005 | Holmes et al. | |
| 6,927,579 B2 | 8/2005 | Blades | |
| 6,985,771 B2 | 1/2006 | Fischell et al. | |
| 7,130,624 B1 | 10/2006 | Jackson et al. | |
| 7,138,936 B2 | 11/2006 | Duff et al. | |
| 7,188,037 B2 | 3/2007 | Hidehira | |
| 7,391,356 B2 | 6/2008 | Brumley et al. | |
| 7,464,005 B1 | 12/2008 | Beetner | |
| 7,512,511 B1 | 3/2009 | Schultz et al. | |
| 7,515,094 B2 | 4/2009 | Keller, III | |
| 7,609,199 B2 | 10/2009 | Nishijima et al. | |
| 7,639,178 B1 | 12/2009 | Mulbrook et al. | |
| 7,777,671 B2 | 8/2010 | Schnitzer et al. | |
| 7,777,672 B2 | 8/2010 | Schnitzer et al. | |
| 7,844,341 B2 | 11/2010 | Von Arx et al. | |
| 8,063,813 B1 | 11/2011 | Keller | |
| 9,772,363 B2* | 9/2017 | Canne | G01R 31/002 |
| 2002/0160717 A1* | 10/2002 | Persson | G01R 29/0821 455/67.11 |
| 2005/0265124 A1 | 12/2005 | Smith | |
| 2006/0152232 A1 | 7/2006 | Shvets et al. | |
| 2007/0027643 A1 | 2/2007 | Lesesky et al. | |
| 2007/0229270 A1 | 10/2007 | Rofougaran | |
| 2007/0234058 A1 | 10/2007 | White | |
| 2007/0279071 A1 | 12/2007 | Orton | |
| 2008/0103555 A1 | 5/2008 | Dicks et al. | |
| 2008/0284609 A1 | 11/2008 | Rofougaran | |
| 2009/0099830 A1 | 4/2009 | Gross et al. | |
| 2009/0218657 A1 | 9/2009 | Rofougaran | |
| 2010/0033386 A1 | 2/2010 | Lewis et al. | |
| 2010/0123453 A1 | 5/2010 | Pauly et al. | |
| 2010/0125438 A1 | 5/2010 | Audet | |
| 2010/0237854 A1 | 9/2010 | Kumhyr et al. | |
| 2010/0241864 A1 | 9/2010 | Kelley et al. | |
| 2010/0332199 A1 | 12/2010 | Dhanekula et al. | |
| 2011/0320170 A1 | 12/2011 | Pathak et al. | |
| 2012/0179812 A1 | 7/2012 | Keller, III | |
| 2012/0223403 A1 | 9/2012 | Keller, III et al. | |
| 2012/0226463 A1 | 9/2012 | Keller, III et al. | |

FOREIGN PATENT DOCUMENTS

| | | |
|---|---|---|
| JP | 2003503679 | 1/2003 |
| JP | 2011174709 | 9/2011 |
| JP | 2012026913 | 2/2012 |
| KR | 100946238 | 3/2010 |
| KR | 101077441 | 10/2011 |
| WO | 2009047585 | 4/2009 |

OTHER PUBLICATIONS

Ashwin Lakshminarasimhan, Electromagnetic Side-Channel Analysis for Hardware and Software Watermarking, Master of Science in Electrical and Computer Engineering; Sep. 2011.

* cited by examiner

AUTOMATED ANALYSIS OF RF EFFECTS ON ELECTRONIC DEVICES THROUGH THE USE OF DEVICE UNINTENDED EMISSIONS

CROSS-REFERENCE TO RELATED APPLICATIONS

This application is related to and claims priority from U.S. Provisional Patent Application Ser. No. 61/966,559 filed on Feb. 26, 2014 and entitled "Automated Analysis of RF Effects on Electronic Devices Through of the Use of Device Unintended Emissions".

STATEMENT REGARDING FEDERALLY SPONSORED RESEARCH AND DEVELOPMENT

N/A

REFERENCE TO SEQUENCE LISTING, A TABLE, OR A COMPUTER PROGRAM LISTING COMPACT DISC APPENDIX

N/A

BACKGROUND

1. Technical Field

The subject matter relates to monitoring and measuring the disruption of radio frequency signatures caused by external influences. It further relates to remote monitoring of the disruption via observation of effect of RF illumination on electronic devices based on monitoring unintended RF emissions.

2. Description of Related Art

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Generally, powered electrical and electronic devices give off electromagnetic emissions throughout wide spectral regions, typically in the Radio Frequency (RF) regime. Electronic devices can be also impacted by outside sources of electromagnetic radiation that can couple in different ways. When the coupled electromagnetic energy exceeds thresholds that the electronic circuits are designed to operate under, operation of the device may be upset or the device may fail.

Various means may be used to disrupt the operation of electronic devices for a variety of reasons. Cell-phone blockers can be used to reduce the disruption caused by unexpected phone calls in crowded restaurants or theaters. RF jammers may be used to disrupt communication for anti-propaganda purposes. High power RF or high power microwave sources have been known to intentionally or unintentionally disrupt or damage electronic devices. However, all the above current means may be incapable of a sophisticated detailed range and variety of operational influence upon the effected electronic devices. These current means are typically incapable of creating a subtle, sophisticated range of effects in the influenced device, ranging from indiscernible to impaired, to temporarily disabled, to permanently disabled. Electronic devices are susceptible to interference, disruption or destruction when exposed to high-powered RF signals. This can be caused by unintentional exposure to RF sources, or by intentional illumination, typically for the purposes of obtaining more detailed device status or device intrinsic information or for doing harm. Identification and diagnosis of the interruption of normal functionality of an electronic device from a distance would provide a monitoring ability to assess the state of the device. RF environmental conditions, at a given location, and at a specific relative instant in time, the equipment of interest may work flawlessly without any anomalies whatsoever. Change any of these conditions with respect to the electromagnetic environment incident on the equipment and equipment upset or failure may not occur because both the electromagnetic environmental (EME) disturbances and the equipment's response to these disturbances are not well defined. If a measurement based approach is not made to understanding these responses the likely impact or none impact on equipment is merely statistical in nature.

The current methods do not provide a means to test all the possible combinations of frequencies, amplitudes, modulation waveforms, spatial distributions, and relative timing of the many simultaneous interfering signals that an operating system may encounter. The parameter space is just too large to possibly assess without feedback from the device that is subject to intelligently changing the illumination parameters.

Therefore, there is a need for an improved assessment of the effects of RF illumination on electrical or electronic devices and a further need for a method that provides a way to find frequency and modulation parameters causing maximum susceptibility of electrical or electronic devices and, an additional need to understand impact of an illumination source on electrical or electronic devices.

SUMMARY

In one aspect, the invention provides an apparatus configured and operable to determine a state and/or an operation of a powered electrical device. The apparatus comprises one or more antennas; a receiver coupled to the one or more antennas and operable to receive emission(s) of electromagnetic energy from the device; a second antenna; an illumination device coupled to the one or more antennas so as to illuminate the device with a pulse of electromagnetic energy; a controller including one or more processors, a non-transitory computer readable medium comprising executable instructions that, when executed by the one or more processors, cause the one or more processors to perform the steps of selecting a spectral frequency target component of the emission(s), iteratively or recursively controlling the illumination device to illuminate the device with the pulse, measuring, at each iteration, a change in characteristic(s) of the spectral frequency target component of the emission(s), assigning a score value to each measurement, and iteratively effecting optimized parameter(s) of the pulse based on the score value until a final score value indicates a desired state and/or an operation of the device.

In one aspect, the iteratively optimized parameters include one or more of a pulse frequency, a pulse width, a pulse duty cycle, a pulse repetition rate, a pulse amplitude, a pulse duration, a pulse repetition pattern, a pulse amplitude envelope and a pulse frequency envelope.

In one aspect, the score value is one of a peak amplitude, a peak signal to noise floor ratio, a change in a frequency zone width around the peak, the number of intermodulation peaks counted above a noise floor and within frequency zone, a total number of peaks observed when the target device is powered on and any combination thereof.

In one aspect, the invention provides a method of at least one of affecting determining and characterizing a state and/or an operation of an electrical device. The method comprises the steps of: selecting a spectral target frequency component within a frequency spectrum of a received emission of electromagnetic energy emitted by an electrical device, the spectral target frequency component characterized by an amplitude being greater than amplitudes of neighboring frequencies within the frequency spectrum; tuning a radio frequency (RF) signal based on the amplitude of the spectral target frequency component; coupling the tuned RF signal to the electrical device; measuring a change in the amplitude of the spectral target frequency component in a response to the coupled tuned signal; and repeating steps (b) through (d) until the change in the amplitude of the spectral target frequency component is within a predetermined amplitude range of the neighboring frequencies.

Other aspects of the invention will become apparent by consideration of the detailed description and accompanying drawings.

BRIEF DESCRIPTION OF THE DRAWINGS

The accompanying drawings are incorporated in and constitute part of the specification and illustrate various embodiments. In the drawings.

DETAILED DESCRIPTION OF THE EXEMPLARY EMBODIMENTS

Figure 1:
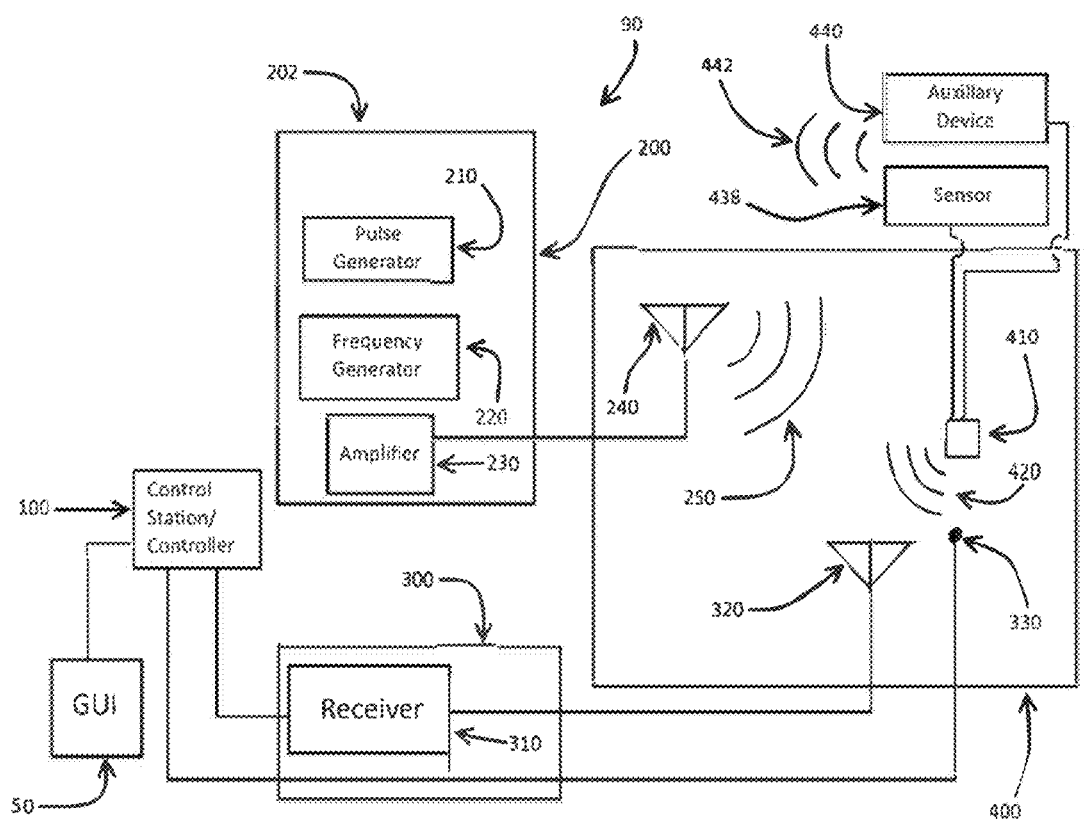
FIG. 1 illustrates a block diagram of an exemplary apparatus for determining at least one of a state and an operation of a powered electrical or electronic device.

Prior to proceeding to the more detailed description of the present invention, it should be noted that, for the sake of clarity and understanding, identical components which have identical functions have been identified with identical reference numerals throughout the several views illustrated in the drawing figures.

The following detailed description is merely exemplary in nature and is not intended to limit the described examples or the application and uses of the described examples. As used herein, the words "example", "exemplary" or "illustrative" means "serving as an example, instance, or illustration." Any implementation described herein as "example", "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," "exterior," "interior," and derivatives thereof shall relate to the invention as oriented in the Figures. Furthermore, there is no intention to be bound by any expressed or implied theory presented in the preceding technical field, background, or the following detailed description. It is also to be understood that the specific devices and processes illustrated in the attached drawings, and described in the following specification, are simply examples of the inventive concepts defined in the appended claims. Hence, specific dimensions and other physical characteristics relating to the examples disclosed herein are not to be considered as limiting, unless the claims expressly state otherwise.

The subject matter relates to a powered electrical and/or an electronic device, hereinafter referred to as "device" or "target device" that emits electromagnetic energy in a powered state. The examples of such devices may include, without limitations, a computer, a tablet, a mobile communication device, a circuit of electronic components, a semiconductor chip, an integrated circuit, any device that incorporates one or more electronic components and/or circuits and the like.

The particular embodiments of the present disclosure generally provide apparatus and method(s) directed to determining and/or affecting at least one of a state and an operation of the device based on a response of intended or unintended emissions of electromagnetic energy from the device, particularly in the radio frequency (RF) spectrum, to an illumination energy signal coupled to the device.

The particular embodiments of the present disclosure are generally illustrated and described in a combination with an RF signal generator and amplifier, although it will be apparent to those skilled in the relevant art that the present invention may be applied to other signal generation equipment and as such should not be interpreted as a limiting factor of the function of the present invention.

In order to provide monitoring and/or assessment of temporary or permanent effects onto the target device 410, functionality of the target device 410 can be measured using the RF signature of the emissions emanating, as internal time-varying RF energy radiation, from components, circuits, wires and/or traces within the device.

In some examples, this radiated energy in the form of RF emissions may escape through seams and apertures in the target device packaging (i.e. back-door propagation), while in other examples, the energy directly radiates away from the target device via leakage on existing device antenna elements (i.e. front-door propagation). In either example, however, these emissions contain information about the state of the target device which may be exploited to identify its susceptibility to illumination and/or RF effect from illumination.

Any changes to this signature indicate a change in state or functionality of the target device. In particular, correlation of effects on the monitored signature of unintended RF emissions of the target devices, as measured remotely while being illuminated, provides for the assessment of target device 410 status from a distance. These unintended emissions may be referred to as Electromagnetic Inference (EMI) in other contexts. Useful variations in these unintended emissions necessarily are caused by a source RF energy reaching and affecting the internal element which generated the emission.

The particular embodiments also provide a method and apparatus for automatically receiving and analyzing the unintended emissions of the devices during illumination from an illumination source to rapidly determine the efficacy and range of effects of illumination source waveform parameters.

The particular embodiments further provide a means to exhaustively find the best combination of RF frequency, RF signal level, RF pulse width, duty cycle, and repeat rate to create a specific unintended disruption, effect or disablement; a means to exhaustively find all possible effected unintended states of an electronic device, from unaffected thru affected and/or influenced in a specific manner and/or disabled to permanently change in a specific manner to permanently disabled or destroyed; and an iterative means to exhaustively scan all possible states in a highly time efficient manner, avoiding wasteful repetition of settings and avoiding the possibility of missing important RF influencing combinations which may be of significance or value in influencing an electronic device in a specific manner or of missing important states of being influenced.

Some particular embodiments may rely on information derived from unintended emissions to determine which specific waveforms maximize the RF effect on the target device.

Some particular embodiments disclose and/or recognize a wide span of influences, effects and disruptions which can occur when the electrical or electronic device receives through internal circuit elements, not intended to function as antennas or receivers, unexpected electromagnetic signals of a specific frequency, strength and/or pulse characteristics other than those, if any, which are normally intended to interact with it.

Further, some particular embodiments disclose means to automatically (within the software algorithm and without manual intervention by the user) determine and/or store and recall the specific frequency, strength and/or pulse characteristics which unexpectedly influence the electrical or electronic device in one specific manner.

Further still, some particular embodiments disclose a comprehensive means to generate all possible electromagnetic signal influences upon an electronic device to find the best combination of electromagnetic characteristics to create one specific influence on that device. Further still, the exemplary embodiments disclose a means to systematically determine all possible disrupted and influenced states an electronic device is unintentionally capable of assuming.

Further still, some particular embodiments disclose a means to systematically and automatically determine not only all possible disrupted states that the electrical or electronic device can unintentionally attain, but also the means and combination of parameters to best determine and transmit a specific electromagnetic signal with unique characteristics to create all possible states. Further still, the exemplary embodiments disclose a detailed methodical step-by-step iterative means to automatically determine all of the above.

Reference is now made to FIG. 1 of the drawings that illustrates an exemplary apparatus 90 configured and operable to determine and/or affect at least one of a state and an operation of the target device 410 subjected to illumination by a pulse of electromagnetic energy. The apparatus 90 includes a control station or controller 100, that may be a general-purpose computer providing user-interface, data storage, program execution and I/O capabilities, and an illumination device, transmitter, tuner or component 200 that is coupled to the controller 100. The illumination device or tuner 200 may include a pulse generator 210, a frequency generator 220 and an amplifier 230 having a direct electrical/control connection with a transmit antenna 240. The transmit antenna 240 may be positioned remotely from the illumination device 200 or may be integrated into an enclosure 202 thereof. The illumination device 200 couples a pulse of electromagnetic energy (illumination signal) 250 from the transmit antenna 240 to the target device 410. In other words, the illumination device 200 illuminates target device 410 with electromagnetic energy.

The apparatus 90 further comprises a classification device or component 300 including a receiver 310 that in a combination with a receive antenna 320 collects intended or unintended emissions 420 from the target device 410 while the illumination device 200 couples the pulse of the electromagnetic energy 250 to the target device 410. A controller 100 is coupled to the receiver 310 and includes RF data collection module 104, one or more processors 106, and a non-transitory computer readable medium 108 comprising executable instructions that, when executed by the one or more processors 106, cause the one or more processors 106 to perform an automated sequence that parametrically varies the illumination parameters continuously and/or repetitively measuring and analyzing resulting emissions. It would be understood that the executable instructions can be also referred to as software algorithm. Based on feedback, determined within controller 100, from changes in the collected intended or unintended emissions 240 indicative of the impact of the illumination parameters onto the target device 410, the one or more processors 106 execute logic algorithms/instructions that effect optimized (changed, adjusted, varied or fine tuned) the parameters of the pulse of electromagnetic energy 250 in a relationship to regions of response until the executable instructions cause the one or more processors 206 to select optimized parameters of the pulse of electromagnetic energy 250 illuminating the target device 410. The optimized parameters then either partially change the operational characteristics of the target device 410 or completely destroy operability thereof. Such optimized parameters includes any one of change in pulse duration, change in pulse amplitude, change in pulse train separation time between pulses, change in pulse frequency or similar modifications which achieve the specific response without insufficient or excessive results indicating invoking a different category or type of effect far beyond that desired such as complete permanent destruction and disablement of the target device 410 caused by excessive illumination power.

The controller 100 further comprises a memory 110 that stores parameters from intended or unintended emissions 420, analysis and classification of such parameters and calculated parameters of the pulse of electromagnetic energy 250.

A graphic user interface (GUI) 50 and field probe 330 may be operatively connected to the control station 100.

In operation, following emissions spectrum classification by analysis of the received intended or unintended emissions 420, the control station 100 operates the illumination component 200 to subject the target device 410 to an RF illumination signal 250. Based on the illumination control settings stored on the control station 100, the illumination parameters on the pulse generator 210 and frequency generator 220 are adjusted. The RF signal then passes to the amplifier 230 which increases the strength of the illumination signal as controlled within the illumination control. The illumination signal 250 is transmitted by the transmit antenna 240 and exposes the target device 410 to the prescribed illumination parameters.

While the target device 410 is under illumination, the classification device 300 collects emission spectrum data via the receive antenna 320. Information concerning the power of the illumination RF field strength may be collected using the field probe 330. The collected emission spectrum data is analyzed and compared to the characterization data, collected while the target device 410 was not under illumination, by the controller 100 or stored within the memory 110. A score is generated to measure the change from the baseline (non-illuminated) spectrum illustrated in FIGS. 3b and 5a. After the illumination and collection sequence is performed for a pre-set, interpolatively or extrapolatively calculated series of illumination parameters, the controller 100 selects a parameter sets which yielded the highest scores via the Baseline Comparison, relating to desired disruption of the operation of the target device 410 that is determined by characteristics of the emissions spectrum including, but not limited to, amplitude suppression, induced feature content, and feature distortion, indicating a change in the operation of the device. The controller 100 is then operable to select a new set of parameters that focuses on the range of highest measured effect and the illumination and collection sequence is repeated with these settings. This iterative process is repeated to identify and hone in on the most effective illumination parameters. Such most effective illumination parameters may be the minimum power at the optimal frequency to generate a desired response such as a response of disabling operation of a data receiver with a 99% certainty without inhibiting operation of a transmitter circuit within a transceiver. It should be noted that the data transceiver's local oscillators unintended emission analysis and suppression can be all that is needed to indicate suppression of the device, and that the target device 410 need not be actually intentionally transmitting or receiving data.

The term "most effective illumination parameters" are to mean herein as illumination parameters that disrupt or modify operation of the target device 410, modify operational state of the device 410, change in the operation of the device (for example a radio no longer receiving audio), result in a change in or loss of the current drawn by the device 410 (as for example measured by the field probe 330 which may also contain an AC/DC milliGaussmeter to cover the lower frequency ranges not covered by the field probe) temporarily disable, neutralize or permanently disable operation of the target device 410.

In one example, a change in AC current draw as an unintended emission or indicator at very low frequencies may indicate loss of one or more components of the target device 410 and a corresponding change in operation thereof. Near complete loss of current draw may indicate permanent disablement or loss of operability of the target device 410. Complete loss of RF emissions from the target device 410, especially after illumination is turned off may also indicate permanent disablement or loss of operability thereof. If the target device 410 is for example a cell phone, loss of any RF emission may at least indicate that the cell phone no longer functions as a transmitter and may further indicate that the cell phone no longer functions as a receiver.

Figure 2:
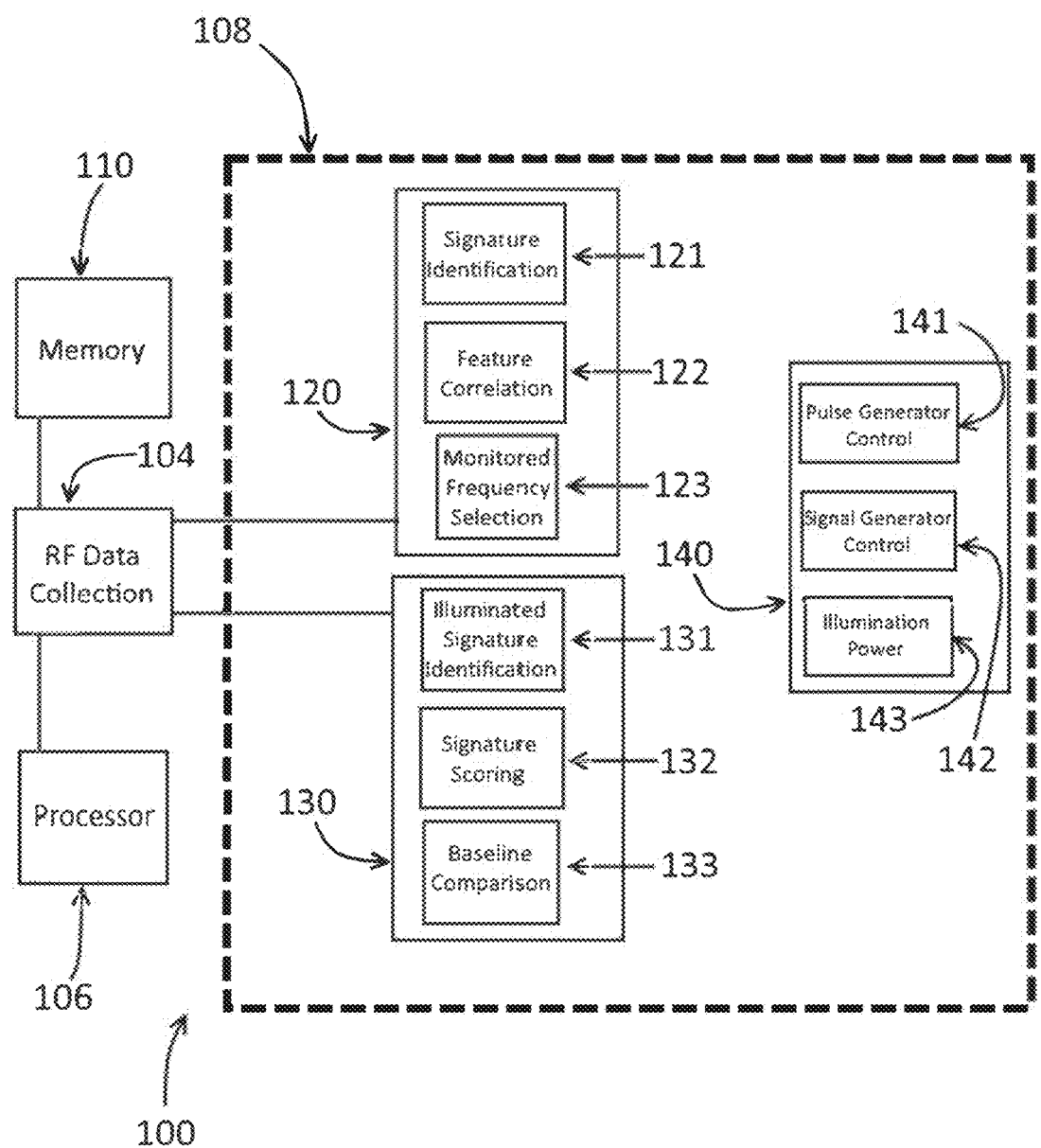
FIG. 2 illustrates a block diagram of an exemplary controller employed within the apparatus of FIG. 1.

Reference is now made to FIG. 2 of the drawings that illustrates details of the controller 100 comprising non-transitory computer readable medium 108 including executable instructions. The non-transitory computer readable medium 108 includes a spectrum characterization module 120, a spectrum scoring module 130, and an illumination control module 140. Furthermore, RF data collection module 104 may contain additional executable instructions operable related, for example, to converting analog to digital data.

When the initial characterization is required, once the device 410 is powered and may be placed within an optional chamber 400, for example of an anechoic type, the controller 100 contains executable instructions that cause one or more processors 106 to provide received wideband RF spectrum data to the spectrum characterization module 120. The signature identification tool 121 contains executable instructions that cause one or more processors 106 to analyze emission spectrum without active illumination to identify features unique to the particular device 410. Signature identification tool or component 121 identifies features such as signature peaks (highest peak location in MHz and peak height dB level above noise floor and peak width in Hz at half peak height), complex peak structure or groups of peaks (individual MHz location of peaks within the group and relative Hz separation), time variant content (ex. repetitive peak shape or dB change patterns or movement in frequency vs. time), changes in noise floor, and other similar features. Unique feature characteristics include items such as specific feature frequencies, frequency of signature elements, content of features groups, etc. Feature correlation tool or component 122 contains executable instructions that cause one or more processors 106 to determine relationships between multiple features identified within the emission spectrum. Based on this analysis, specified narrowband frequency spans are selected via the monitored frequency selection tool or component 123 to be (typically next) used in data collection during illumination.

The illumination control module 140 is then triggered to cause the illumination device 200 to illuminate the target device 410. Based on the results from the spectrum scoring module 130, a pulse generator control tool or component 141 and a signal generator control tool or component 142 are adjusted to provide appropriate illumination. Appropriate illumination calculated may typically be an interpolated power output dB level between the previous higher power level which achieved complete suppression of an automatically observed operation such as an automatically observed digital signal transmission and an earlier lower power level which caused reception indicating very sporadic suppression of the observed digital signal transmission. Alternatively, the Local Oscillator associated with the digital signal transmitter may be received and evaluated to indicate suppression. The Local Oscillator frequency of operation may be pre-known by device specifications, schematics, comparison to similar other devices or models and their internal component specifications, or a set of candidate assumptions based on the previously known or observed other crystal frequencies and transceiver frequencies of the device. The illumination power tool or component 143 contains executable instructions that cause one or more processors 106 to control the amplifier 230 and selectively turn on and off the illumination pulse 250 as well as selectively control its power levels. The initial illumination parameters of the illumination control module 140 are comprised of a range of values of several parameters, for example pulse width, pulse duty cycle, pulse repetition frequency, and pulse amplitude carrier frequency. Within each parameter several values spaced across the parameter's value space of interest are selected (i.e. initial frequency to initial frequency+10 MHz, initial frequency+

10 MHz to initial frequency+20 MHz, etc.). Each combination of the parameter values is tested during the first iteration of illumination settings. For the second iteration, a similar set of narrower span parameter settings are selected within a range of interest focused around the highest scoring parameter set of the previous iteration. The illumination control module 140 may be alternatively located within the illumination device 200.

It should be noted that the first and second antenna, 320 and 240 respectively, could be the same antenna coupled by an RF splitter/combiner, especially if the illumination frequency is separate and/or far from the received emission frequency . . . or if the signals are interleaved in time very quickly. In the case of a 3 meter distance between the antenna and the device, the transmit time would be about 10 nanoseconds and receive time window would be about 10 nanoseconds. This example is effectively feasible for illumination frequencies above about 250 Mhz.

During illumination, the RF data collection module 110 collects illuminated spectrum via the receive antenna 320 and receiver 310 and the spectrum scoring module 130 analyzes the spectrum. Signature identification tool or component 131 contains executable instructions that cause one or more processors 106 to analyze to analyze collected RF spectrum during active illumination to identify features in the emissions spectrum in a similar manner to the initial characterization of the target device 410. The signature scoring tool or component 132 contains executable instructions that cause one or more processors 106 to assign a score to each spectrum collected under illumination. The scores are assigned based on the presence of features or specific changes to features or induced features within the spectrum. Known correlations between specific induced features and electronic component level of functionality are used to set the scoring metrics. Baseline comparison tool or component 133 contains executable instructions that cause one or more processors 106 and is operable to compare each score to the baseline so as to measure the degree of degradation or change of the emissions spectrum and thereby the degradation or change of the state or operation of the target device 410.

Figure 3A:
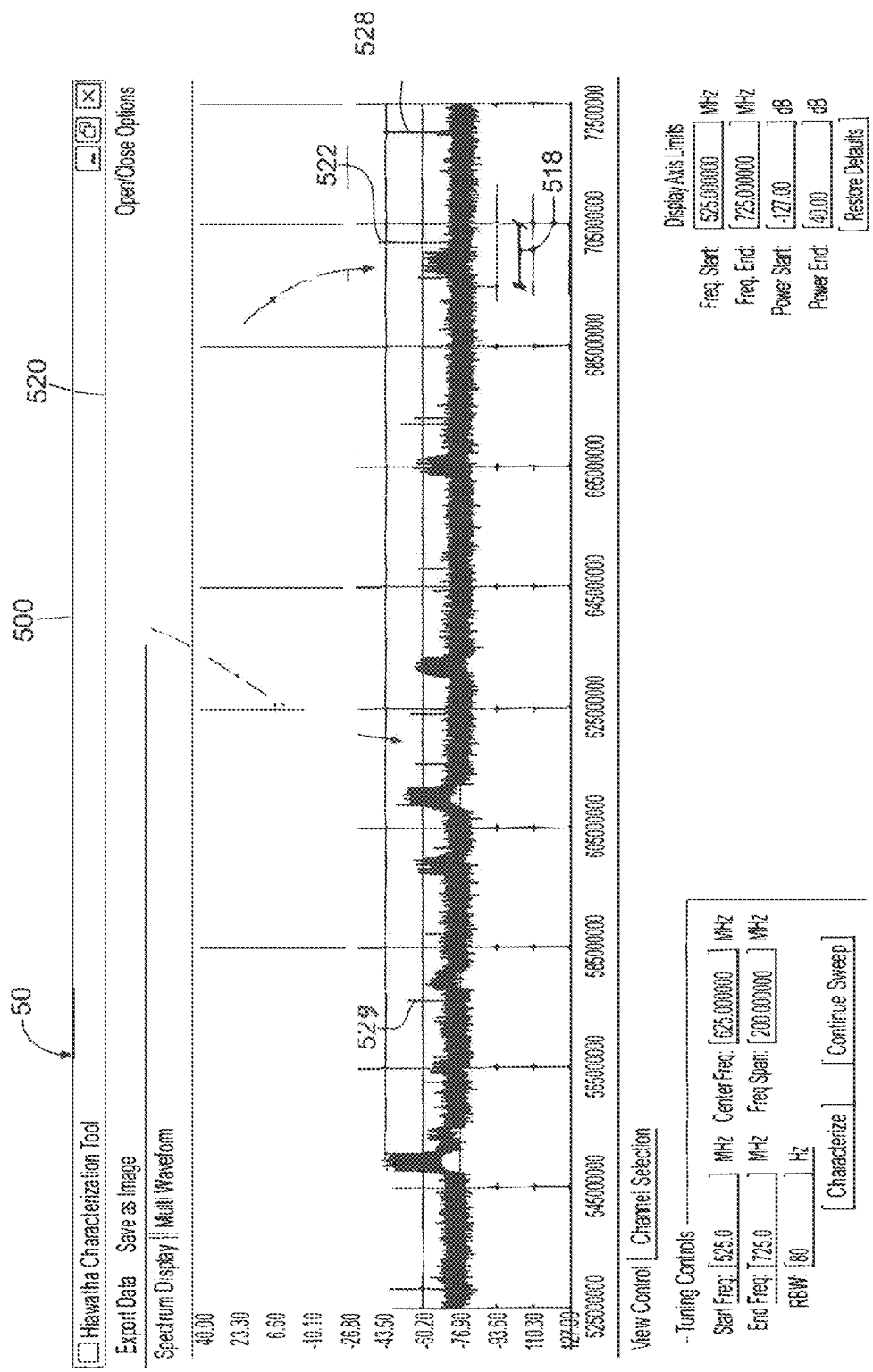
FIG. 3a illustrates an exemplary image of a wideband emission spectrum within emitted from the powered electrical or electronic device and collected at the apparatus of FIG. 1 and that may be generally shown in a graphical user interface (GUI of such apparatus.
Figure 3B:
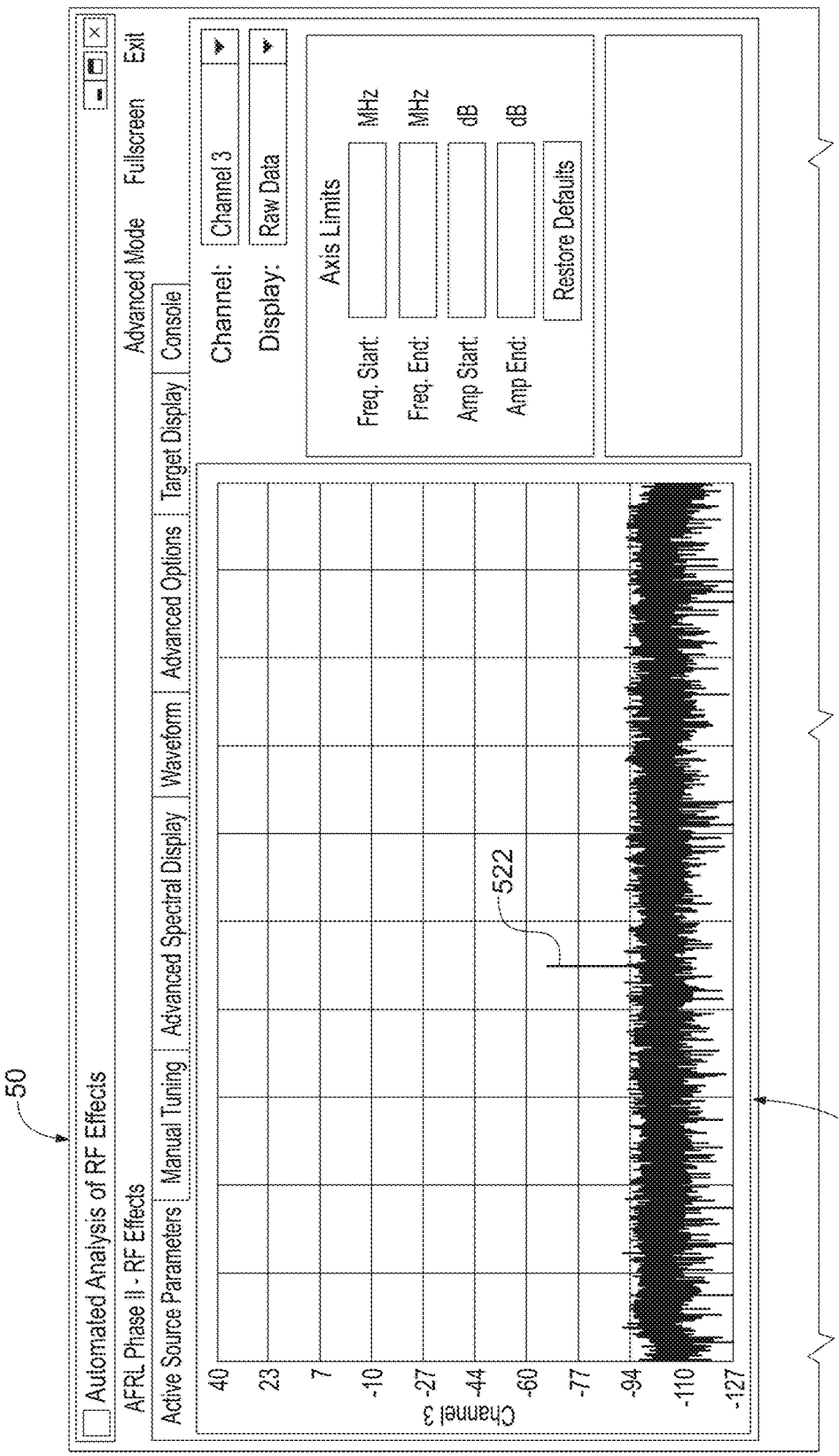
FIG. 3b illustrates an enlarged exemplary image of a narrowband emission spectrum selected from the wideband emission spectrum of FIG. 3a and generally shown in the GUI.

FIG. 3a illustrates an exemplary image within the graphical user interface (GUI) 50 that is indicative of a wideband emission spectrum 500 collected from the target device 410 and FIG. 3b illustrates an exemplary image within the GUI 50 showing an enlarged view of a target narrowband emission spectrum 520 selected from the wideband emission spectrum 500 of FIG. 3a.

By way of an example only, the wideband emission spectrum 500 may have a span of 200 MHz and the target narrowband emission spectrum 520 may have a span of 16 KHz around the center frequency.

In a further reference to FIG. 3a, when the initial characterization is required and acquired, a wideband scan of the emissions by the receiver 310 from a target device 410 results in a wideband emission spectrum 500. The apparatus 90 is then configured and operable to incrementally analyze the entire wideband emission spectrum 500 in selected increments, by way of one example only being 10 MHz segments, starting, for example, from the lower value of 525 MHz and then selecting an interval of interest within wideband emission spectrum 500 based on location and presence of spectral features found within that wideband emission spectrum 500. Such interval of interest may be selected due to observed presence of a peak, for example such as peak 522, either of a preselected absolute power level (amplitude in dB) or a relative difference between the top of the peak and the noise floor 510. As an example in FIG. 3A, because a single or a group of amplitude peaks can signify an operational feature of the target device 410, the apparatus 90 may be configured and operable to find and select an intermediate target narrowband emission spectrum (candidate region) 518 in the range from about 695 MHz to about 705 MHz (with a span of 10 MHz and an RBW of about 100 kHz) wherein one or more sufficiently high candidate peaks 522 contained therewithin are received and automatically programmatically recognized at about 700.0 MHz. When such candidate peak 522 is found, the receiver 310 is re-tuned to a center frequency of about 700.0 MHz and narrowed in span to about 0.100 MHz or 100 KHz with a change in RBW to about 1 KHz (and an associated minimum dwell time of 1 millisecond) to span from about 699.95 MHz to about 700.05 MHz, with 100 usable Fast Fourier Transform (FFT) bins at 1 KHz separation width each, instead of initial or previous 100 KHz. It should be noted that the reduction in RBW causes a longer dwell time inversely proportional to the RBW, and hence longer acquisition time, thus an advantage of the instant invention can be more efficient time utilization in locating important features more quickly with high accuracy. As an example, an initial RBW of 1 KHz equates to a minimum dwell time of about 1 millisecond whereas a more focused and sensitive RBW of about 1 Hz equates to a minimum dwell time of about 1 second.

If the peak 522 were then discerned to be at about 699.90 MHz, the receiver 310 may be then re-tuned to center on 699.90 MHz with a new span setting of 1 KHz and the Resolution Bandwidth (RBW) would typically change to about 10 Hz with a minimum dwell time of about 100 milliseconds. The peak 522 may then next be more precisely seen at 699.998 MHz. Features around this peak 522 such as other associated lower peaks may now be discerned at higher or lower frequencies or both, as well as modulations of the peak, phase noise, peak shape, peak width along the frequency range, discernment of two or more narrowly separated peaks making up the originally seen peak, etc. Although a lower RBW requires a longer dwell time, the lower RBW typically serves to improve the dB sensitivity and frequency resolution, improving the extraction of frequency boundaries features and their characteristics within this new region.

This step may be taken further to narrow the span to 10 Hz with an RBW of 0.1 Hz and a minimum dwell time of 10 seconds to further more accurately discern the shape and features of the peaks and their shapes within the candidate region.

The process may be then continues to identify additional features, for example such as peaks 529 and 529, until the entire wideband emission spectrum 500 has been analyzed and/or affected.

More specifically, the iterative or recursive process of discovery of candidate usefully effectable peaks which affects device operation within the received RF spectrum typically uses automated controlling program logic of executable instructions to tune the receiver 310 initially to a broad spectral region 500, then successively fine tuning the receiver 310 to examine the candidate peaks in more details. Also, the illumination device or transmitter 200 is also separately iteratively or recursively tuned to specific frequency, amplitude and modulation settings to affect the separately received candidate peaks. The transmitted illumination frequencies, amplitudes and modulation may not necessarily be at the received peak frequencies, and may be a sub-harmonic, lower harmonic or higher harmonic, or may simply be a different frequency which may not be obviously mathematically related to the received frequencies of the candidate peak 522.

Simultaneous, consequently, periodically or in conjunction with this process, the control software which automatically controls the emissions receive and illumination transmit hardware can cause the illumination transmitter to also attempt various frequencies and modulations at specific power levels to perturb the device under test and measure the results seen in the spectrum signature's discrete FFT bins at the various frequency settings. The controller 100 may iteratively determine that higher harmonics or higher fractional harmonics of the observed peak may result in more effectiveness in modifying the height, breadth or frequency location of the observed peak. The controller 100 may recursively scan transmit frequencies within a range to determine where the highest effect is, then iteratively narrow the range down over and over to more accurately determine a more exact frequency to use to greatest effect. The controller 100 may recursively apply pulse modulation sequences or widths, frequency modulation widths, and/or other modulations or combinations of modulations to find a combination of illumination frequencies, modulations, and power levels which affect the target device 410.

Further, the controller 100 may iteratively change the illumination characteristics above gradually to observe what settings or threshold levels are needed to change the received peaks in a specific manner. For example, what setting(s) will result in a peak reduction of 10 db, or 2 intermodulation peaks on either side being observed at 20 db below the height of the original candidate peak 522.

A score (value) may be represented by one of peak amplitude, peak signal to noise floor ratio 524, a change in frequency in units of kHz, the number of intermodulation peaks 522a counted above the noise floor 510 and within frequency zone 526 being for example within about 50 db and/or within about 20 KHz zone of the highest peak 522, the total number of peaks observed when the target device 410 is powered on and any combination thereof.

In one exemplary embodiment, it is contemplated that an auxiliary device 440 may be employed to affect the operation and/or an operating parameter of the target device 400. Such auxiliary device 440 may be a switch operable to selectively turn on or off power to the target device 410, a power supply device operable to increase or decrease supply voltage to the target device 410, a control device, such as a computer or a controller, operable to control or affect operation of the target device 410, a temperature device, such as a heater thermoelectric cooler, operable to actuate, change and/or vary various modes and/or settings of the target device 410, and change the temperature of the target device 410 by changing the temperature of the operating environment.

The auxiliary device 440 may be or may include a keyboard sending commands to or requesting status changes in the target device 410.

The apparatus 90 may be further adapted to receive and process emissions 442 of the RF energy from the auxiliary device 440 for verification that all required action(s) have been performed. Or, the controller 100 may be connected, either directly or in a wireless mode, to such auxiliary device 440 so as to control operation thereof and receive and process feedback on performed actions.

In another exemplary embodiment, it may be desired to independently verify that the target device 410 is no longer associated with a current draw and/or that the current draw has changed from initial values either during or after the operation of the apparatus 90. A current sensor 438 may be then provided to measure current draw requirements by the target device 410 and may be further interrogated by the apparatus 90, for example by receiving and processing the emissions 442 given off the current sensor 438. The sensor 438 does not have to be limited to the current sensor and may be a temperature sensor confirming the temperature control from the auxiliary device 440, sensing temperature of the target device 410 (for example a disable computer will no longer emit heat) or both. The sensor 438 may be a test instrumentation device for examples such as a voltmeter and/or oscilloscope. The sensor 438 may be an image processing or optical characteristics recognition (OCR) device recognizing elements or characters on a display as a depiction of the internal state or state change of the target device 410. In either example, the sensor 438 is positioned and operable to sense a change in an operating parameter of the target device 410.

Thus, the auxiliary device 440 and/or sensor 438 may provide for an independent assessment and/or verification of the state and/or condition of the target device 410 during or after operation of the apparatus 90.

The auxiliary device 440 and/or sensor 438 may be connected to the target device 410 either by way of a direct connection, a wireless connection or both.

Figure 4:
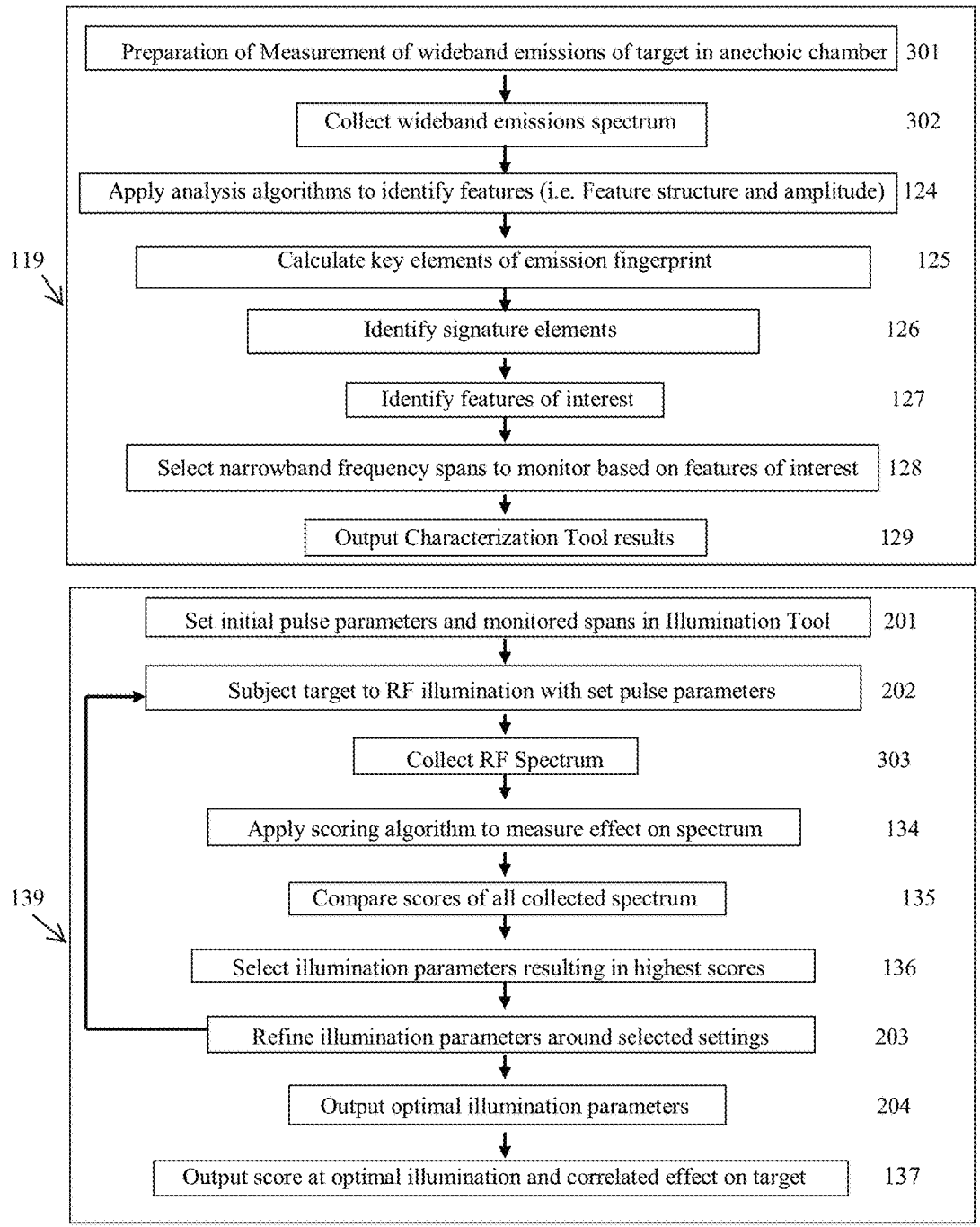
FIG. 4 illustrates a flowchart of an exemplary method for determining at least one of a state and an operation of a powered electrical or electronic device.

Reference is now made to FIG. 4 of the drawings which illustrates an exemplary method of determining at least one of a state and an operation of a target device 410 based on emission(s) of intended and/or unintended RF energy therefrom. The method comprises a step 119 of establishing a baseline measurement or characterizing the target device 410 in a non-illuminated state and the step 139 of determining optimal illumination settings that affect the at least one of a state and an operation of the target device 410.

The step 119 may be performed in an anechoic chamber 400 on any device 410 with unknown signature footprint of intended and/or unintended emissions. The step 119 may be executed by obtaining manufacturer's specifications of such signature footprint. The step 119 may be also executed by collecting and processing intended or unintended emissions without use of the anechoic chamber 400. Although not necessarily limited to such, the step 119 may be executed by disclosures in the U.S. Pat. No. 8,063,813 issued on Nov. 22, 2011 to Keller and titled "Active IED Electronic Signature Detection"; U.S. Pat. No. 8,643,539 issued on Feb. 4, 2014 to Pauly and titled "Advance manufacturing monitoring and diagnostic tool", U.S. Pat. No. 8,537,050 issued on Sep. 17, 2013 to Freeman and titled "Identification and analysis of source emissions thru harmonic phase comparison"; U.S. Pat. No. 8,825,823 issued on Sep. 2, 2014 to Keller and titled "System and method for physically detecting, identifying, diagnosing and Geolocating electronic devices connectable to a network" and U.S. Pat. No. 7,515,094 issued on Apr. 7, 2009 to Keller and titled "Advanced Electromagnetic location of electronic equipment", whose teachings are incorporated by reference in this document. The step 119 may be additionally executed by simply obtaining product specification(s) from the manufacturer of the target device 410.

When the signature footprint is to be obtained within the anechoic chamber 400, the step 119 includes the step 301 of preparing measurement of wideband emissions. Such step may include the step of installing and/or setting up transmitting antenna 240 and receiving antenna 320 within the anechoic chamber 400. Then, wideband emissions spectrum is collected by the receiving antenna 320 and the receiver 310 in step 302 and processed by the controller 100 in step 124 to identify features, for example such as feature structure and amplitude. In step 125, elements of the signature fingerprint and relationships and/or correlations between the elements are calculated. These correlations may include, but are not limited to, any two emissions elements that may be harmonically or non-harmonically related, harmonic series, broadband characteristics, narrow-band characteristics, time domain features, slope, skewness, rise-time, noise characteristics, non-linear features, intermodulation features (such as additional peaks and their spacing and locations caused by intermodulation), phase features, or time varying features. Specific signature elements are then identified by the controller 100 in step 126 and features of interest are selected by the controller 100 in step 127. Next, in step 128, narrowband spectrum spans are selected for monitoring during illumination based on the features of interest selected in step 127. The final output characterization tool results are stored in a controller 100 in the step 129.

The step 139 begins with the step of applying the output characterization tool results from step 129 to establish settings of the illumination device 200. Transmit antenna 240 is then operated to apply set pulse parameters 250 to the target device 410. These parameters may include one or more of the following: illumination strength (in db or watts), illumination frequency, pulse frequency, pulse width, pulse duty cycle, pulse repetition rate, pulse shape, and pulse envelope amplitude. The emissions spectrum 420 from the illuminated target device 410 is collected in step 303 through the receive antenna 320 at the receiver 310 coupled to the receive antenna 320. Signature scoring algorithms are applied by the signature scoring component 132 to the collected emissions spectrum in step 134 so as to measure effect of the illumination on the baseline emissions spectrum collected in step 302. After the results of the entire set of initial illumination parameters are measured and compared in the step 135, the parameters resulting in the highest spectrum scores are identified in the step 136.

The illumination parameters are narrowed and/or refined in the step 203 to center around the identified best parameters. The best parameters can typically be the best frequency at which the Device under test 410 responds to the greatest degree with a specific phenomenon such as reduced correct checksum digital transmission output or suppression of unintended signal from a local oscillator at a dB level of 3 dB. The illumination cycle of steps 202, 303, 134, 135, 136, 203 is repeated a specified number of times and the highest scored parameters are output as the optimal parameters for maximum disruption in step 204 and are correlated to the associated disruption effect on the target device 410 in step 137. Although an iterative approach of repeating the illumination cycle using a new set of narrowed and/or refined illumination parameters to refine the illumination parameters is described herein, other approaches to selecting the initial and subsequent illumination parameters sets can be applied using the same control and analysis methods. These approaches may include calculating initial illumination power output based on distance between transmit antenna 240 to target device 410 and desired estimated initial safe non-destructive illumination power desired at the target device 410 using equivalent power=distance squared law in the Far Field. Also assumed as a good pulse duration for illumination may be an initial 500 microseconds for an audio transceiver communication device, said 500 microseconds corresponding to approximately 2 khz audio frequency. This may be seen as likely much better than a 100 millisecond pulse or a 1 microsecond pulse if the audio circuitry is to be influenced. Other approaches to refining the response of the controller 100 may include a binary search or linear or non-linear interpolation or extrapolation based on measured effects at the recent power levels, pulse durations, or frequencies illuminated using signal 250. As an example only, if a desired suppression of 50% of data being transmitted with accurate checksum is the goal, if the previous power setting of 200 watts yielded a 60% suppression and a separate previous power setting of 100 watts yielded a 40% suppression, an approximate linear interpolation at 150 watts would be expected to yield an approximate 50% suppression.

Figure 5A:
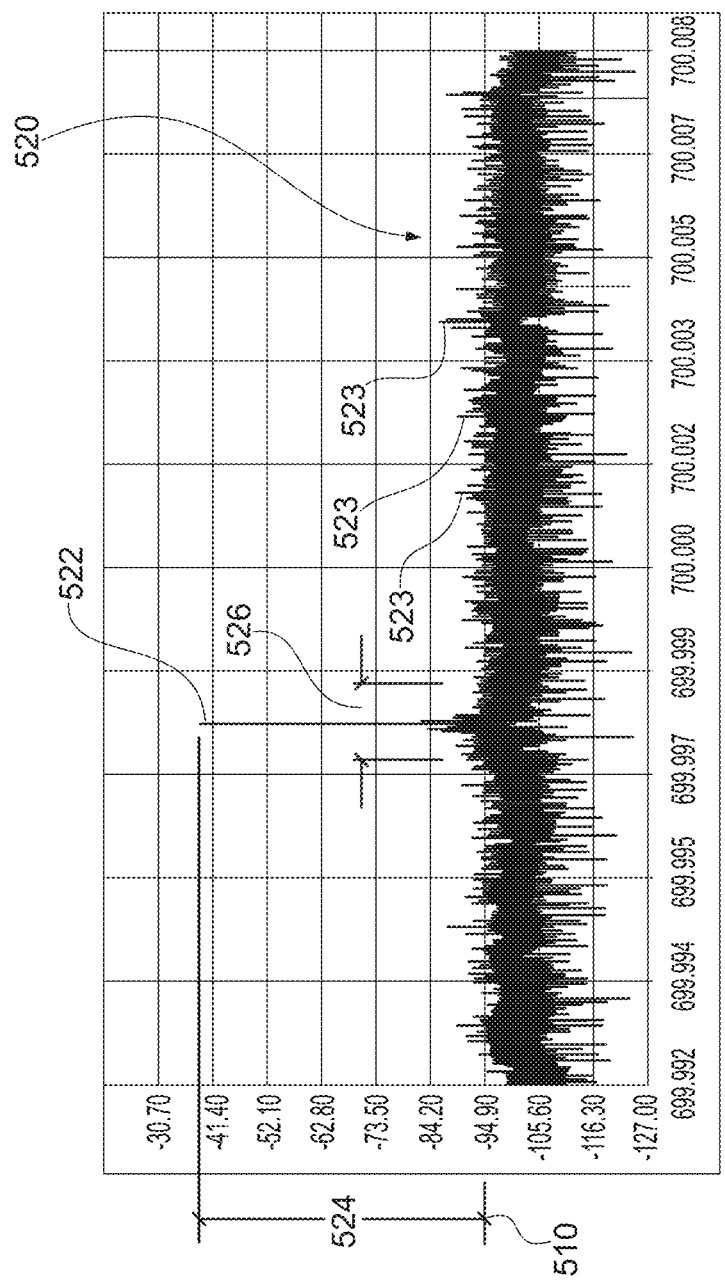
FIGS. 5a-f illustrate an exemplary progression showing the monitored RF emissions of the device, starting with no illumination and the resulting increasing distortion as illumination parameters are optimized.
Figure 5B:
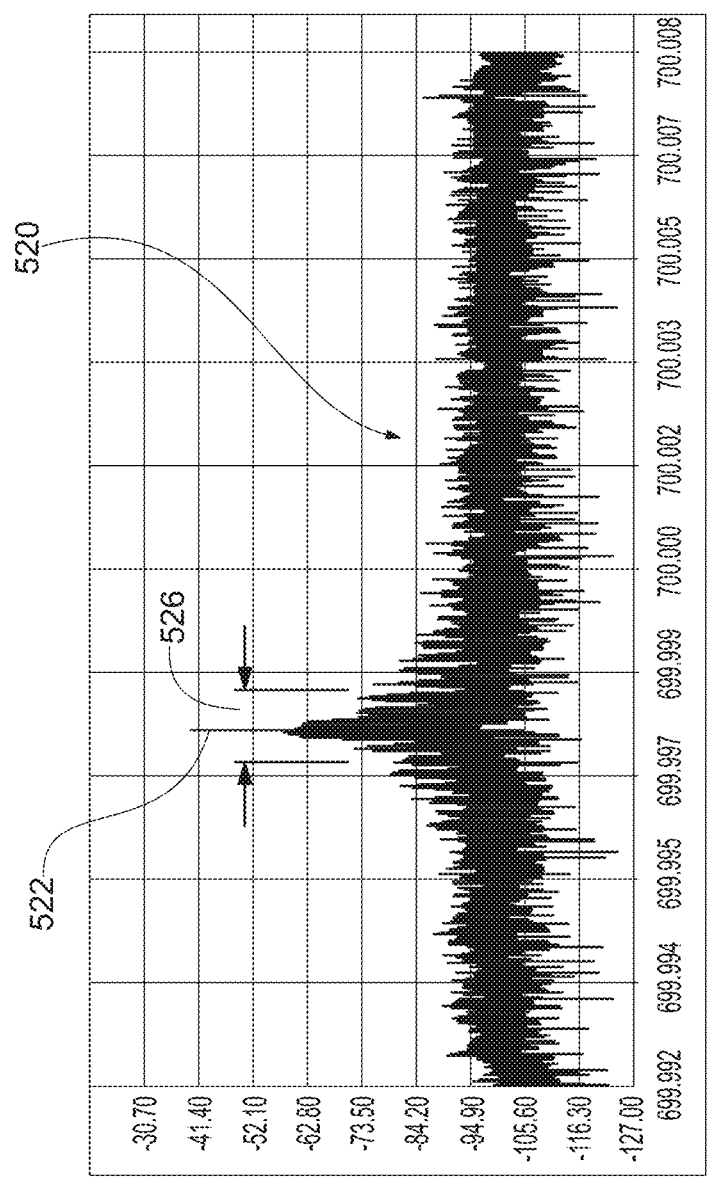
Figure 5C:
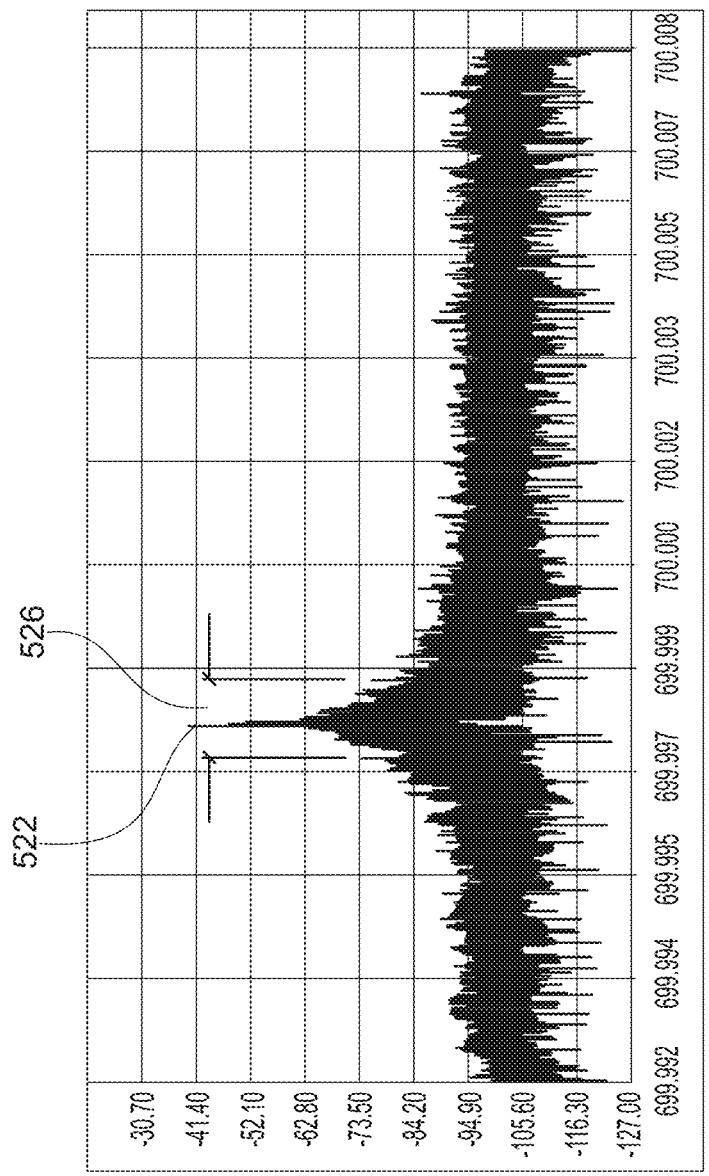
Figure 5D:
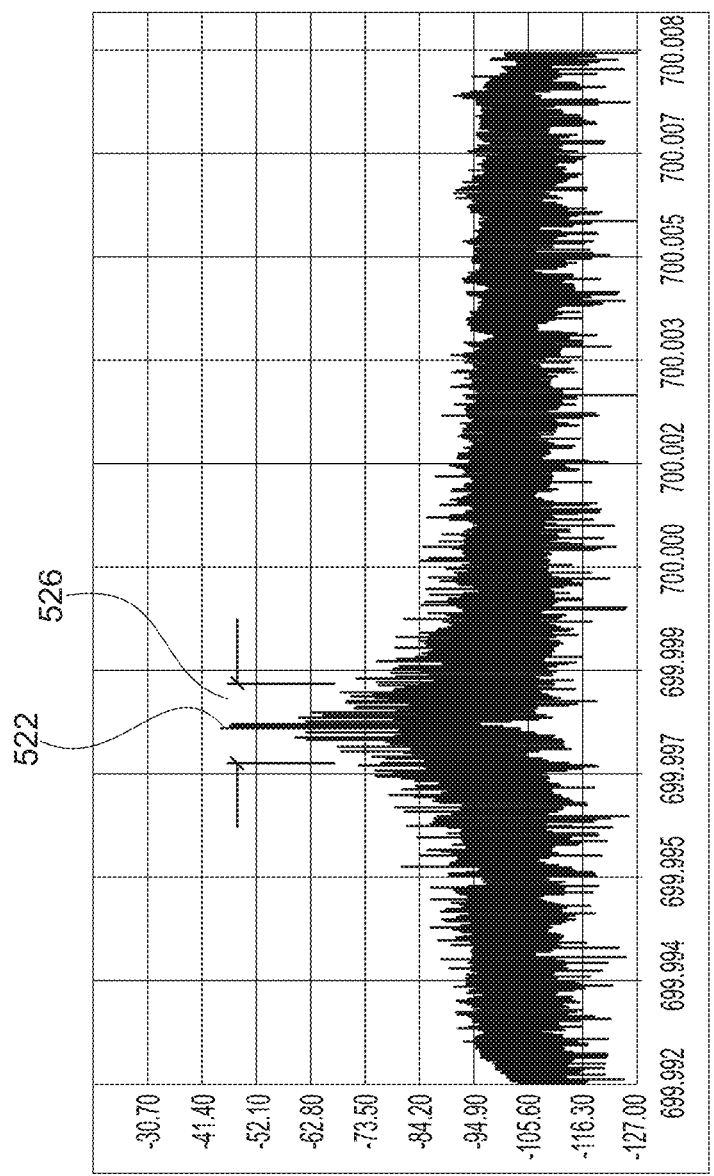
Figure 5E:
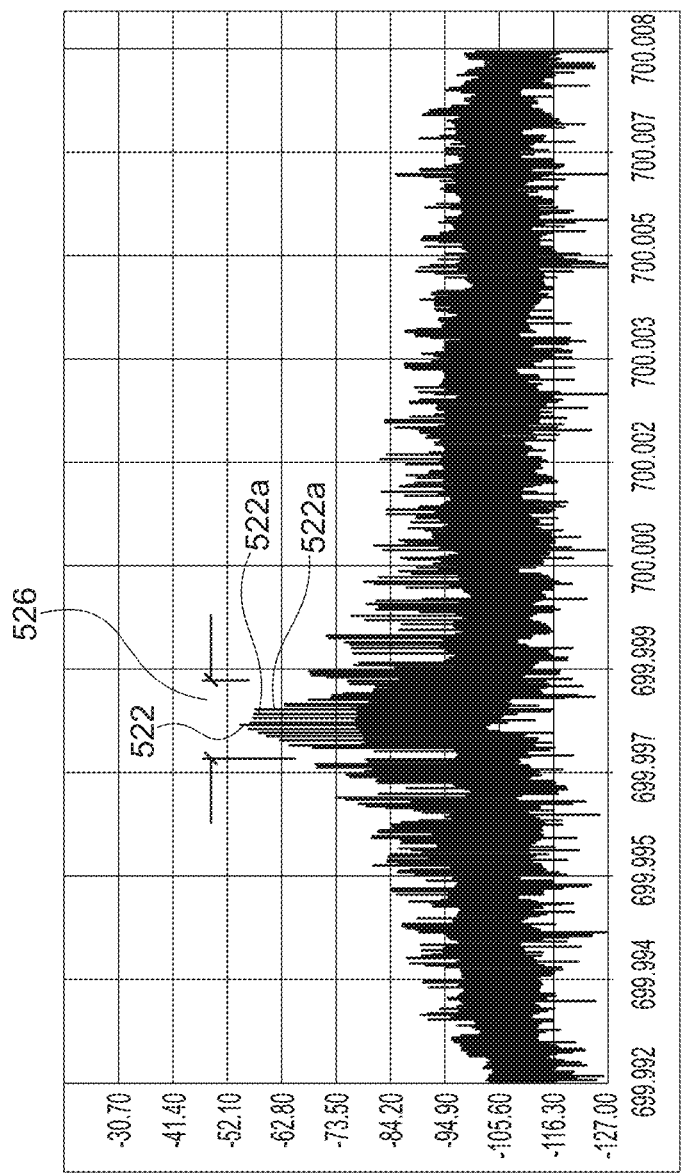
Figure 5F:
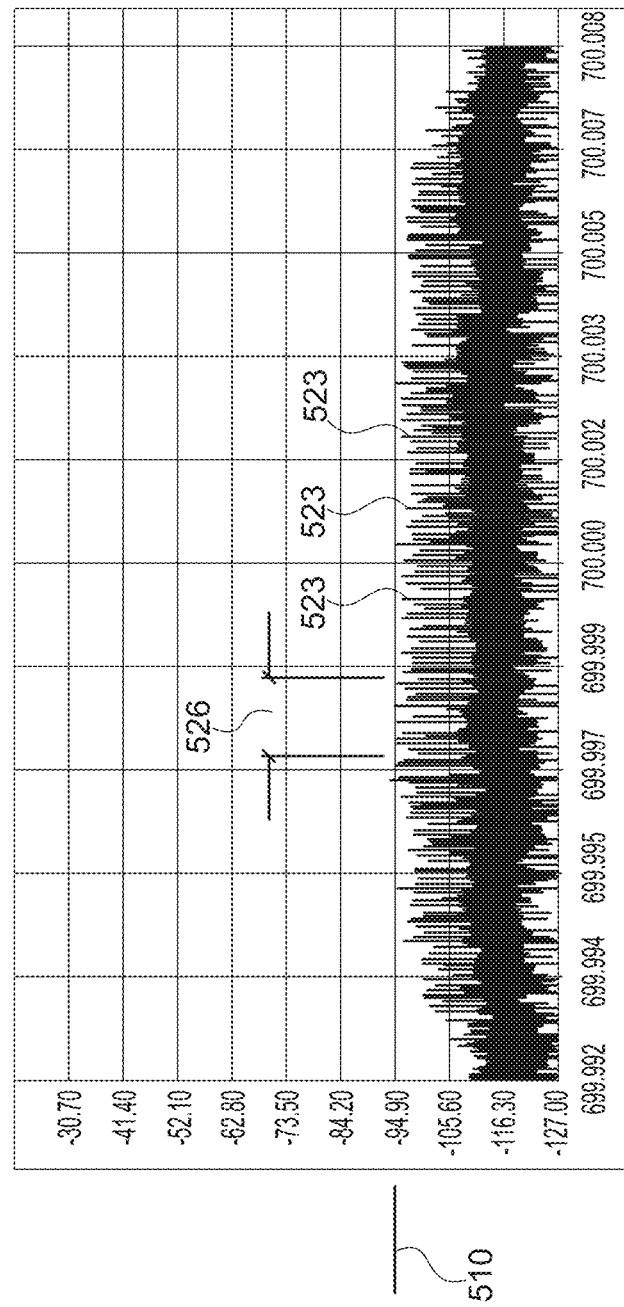

FIGS. 5*a*-5*f* illustrate an exemplary progression of effects of illumination onto target device 410 centered and/or focused on the target peak 522 and further illustrating respective increase in score values. For comparison purposes, FIG. 5*a* illustrates a narrowband frequency range 520 having target peak 522 from the emission signature received at the receiver 310 prior to illumination. The signature parameters of and/or around the peak 522 in FIG. 5*a* would be assigned a score value of zero representing a baseline configuration before illumination. FIG. 5*b* illustrates a change, due to initial illumination, of the emission signature in such narrowband frequency range 520, particularly in frequency zone 526 around the target peak 522. It can be observed that number of secondary or new peaks 522*a* formed in the frequency zone 526 around the base of the target peak 522, although the amplitude of the target peak 522 and its peak signal to noise ratio 524 has not changed. This would result in a higher score value due to new or changed signature features. FIG. 5*c* illustrates another change, due to iterative illumination with varying parameters of the illumination signal 250, of the emission signature in such narrowband frequency range 520, wherein the (frequency) width of the base the target peak 522 has become greater with spacing between secondary peaks 522*a* being essentially eliminated. This would result in even a higher score value. FIG. 5*d* illustrates yet another change, due to the iterative illumination with the varying parameters of the illumination signal 250, of the emission signature in such narrowband frequency range 520, wherein the amplitude of the target peak 522 is reduced and the shape of the base around the target peak 522 is associated with greater spacings between secondary peaks 522*a*. FIG. 5*e* illustrates results due to a further iterative illumination with varying parameters, wherein the amplitude of the target peak 522 reduced further and the amplitude of its secondary surrounding peaks 522*a* increased. Specifically, reduction in amplitude height of the target peak 522 may bias or give greater weight to the score value. Finally, FIG. 5F illustrates results due to a final, in this example, illumination wherein the target peak 522 and secondary peaks 522*a* disappeared and amplitudes (power levels) of peaks 523 of the narrowband emission spectrum 520 is essentially contained within the noise floor level 510, signifying that the operational parameter of the target device 410 originally signified or manifested by the target peak 522 has been suppressed. This result would be assigned a maximum score value and the iteration process would be terminated for this particular peak 522. This may be because the amplitude of the target peak 522 may be the most important feature sufficient for the peak height coefficient to outweigh other considerations.

It will be further understood that the example of FIGS. 5*a*-5*f* can be carried on each peak within the entire wideband spectral region 500 of FIG. 3*a*, essentially eliminating all such peaks and permanently and/or completely disabling the operation of the entire target device 410.

When the target device 410 is illuminated with RF waveforms from a remote source, any variation in the resulting unintended emissions not observed during non-illumination is necessarily caused by source RF energy effects on the device sub-components (e.g. integrated circuits) which generated the emission. The time-domain and frequency-domain shape and character of these variations may be quantified to interpret RF effect and, in turn, leveraged to optimize waveforms for maximum impact on the target device. The variation analysis may be best derived from a change in structure of the emission content; that is, RF effect is best evidenced by a change of a steady-state content. For example, energy masking of the unintended emissions or an increased level of the noise floor 510 appear as an RF effect when viewed naively, but may easily be caused by nonlinear effects created elsewhere in the target device that materialize as overlapping spectral content.

At low source power levels such as about 500 milliwatts in some poorly shielded devices at the Device Under Test 410 location (or, alternatively, with un-optimized source waveform parameters), the low frequency content up-convert on non-linear junctions through mixing with the unintended emission source but do not actively disrupt circuit operation. The result is an energy distribution in the unintended emission as viewed in the frequency domain. At higher power levels such as about 50 watts in some poorly shielded devices at the Device Under Test 410 (or, alternatively, improved source waveform parameters), the offset the bias points of the circuitry, effectively modifying the operational state of transistors within the affected sub-component. Transistors may change region of operation and/or operate with modified parameters due to the increased current flow, including changes in transconductance, bandwidth and output resistance. These changes lead to modifications in the spectral dB level height magnitude of the observed unintended emission.

Detailed knowledge of the existing unintended emissions may be an implicit requirement for a system which analyzes the unintended emissions from the target device 410. Therefore, a thorough characterization of the emissions from the target device 410 may be a critical step required upon acquiring a new target device for evaluation. While simple identification and recording of emissions is needed, of a particular interest is an understanding of the relationships between emissions. That is, patterns of unintended emissions of electronic or electrical components are formed in the time and frequency domain from the underlying signals which exist in the circuitry and an understanding, characterization, or discerning of these patterns is essential to their analysis. It may be only very rarely that an unintended emission may not be related to several others, if not several hundred other, emissions. Digital logic and timing signals, for example, may be wave-based and yield a distribution of signature elements separated from the fundamental clock rate when analyzed in the Fourier frequency domain. In addition, some common analog functionality forms frequency domain patterns through non-linear dynamics and differential frequency content between existing analog signals is often generated due to non-linear junction effects.

Manual analysis of this emission content may be considerably more difficult. Many devices of interest have hundreds, if not thousands, of emissions elements. By establishing the relationship between these emissions, the vast majority of emission content and their association with the devices function can be distilled, measured and understood. Emissions may typically display consistent variations of some parameters under illumination. This behavior is consistent with theory which suggests that source illumination energy, which affects signal generation in an integrated circuit, will affect for example all harmonics within the signal. Thus, an exemplary aspect may include an automated, by way of one or more processes executing executable instructions contained in a non-transitory computer readable medium to perform a pre-assessment of unintended emissions to derive harmonic relationships and, in turn, the emission elements which should be received and processed to analyze induced RF effect. The benefit of pre-assessment of emissions for harmonic content may extend beyond a simple reduction in required processing. In situ harmonics occur when an RF current flows through a device, and harmonics are generated due to the non-linear nature of the device. This can be regarded as a "rusty bolt effect" which exists within the malfunctioning device. One example of this may be a pair of diodes which protect the receivers in many VHF rigs lacking an electromechanical relay to switch between transmit and receive from the transmitter's RF output. In a case of the DJ-F1E clipping receiver protection diode, these diodes can create intermodulation products when the radio set is overloaded, that is the normally sinusoidial waves are clipped or flattened at the top, causing a higher frequency abrupt transition and higher frequency elements within the newly distorted wave, which can be substantially likened to a square wave. These effects are seen throughout unintended emissions of the device being measured.

The identification of affected emission content and related electronic sub-component may be important in determining a correlation between the measured emission changes and the functional effect on the device. Depending on the sub-component affected and the degree of the effect, the state and or operation of the device may be characterized as a temporary, or partial impairment of functionality, automatic restart, reboot or reset of its operation, or a shutdown or permanent damage inhibiting proper operation of the device.

By using the response of the target device being measured via collection of unintended emissions by a non-contact method, the response of the device to these parameters can be assessed and by automating the variation across the necessary parameters in the illumination means coupled with the real time assessment of the response, this invention teaches a novel means to improve assessment of the susceptibility of electrical or electronic device to specific parameters that will cause the most impact to electrical or electronic device of interest.

In one exemplary embodiment, the above described apparatus and method may be used in rebooting an electrical device, such as a computer, if the iterative process determines an abnormal or an out-of-range state and/or operation. A goal of this apparatus thus may be to determine the minimum power level, frequency or frequencies, pulse duration and/or other illumination characteristics to ensure a reboot operation will occur with a 98% certainty at a given distance without transmitting more power which may noticeably affect other devices nearby or which may damage the device.

In another exemplary embodiment, the above described system and method may be used to suppress operation of an electrical device.

In one exemplary embodiment, detection of RF effects from a device is achieved by continuously measuring the unintended emissions of the target device as the illumination parameters are changed and using the collected information to determine the frequency, waveform, modulation, amplitude parameters that cause suppression of the target device.

In another exemplary embodiment, automated analysis of RF effects characterizes disruption of the target device as manifested in the unintended passive RF emissions from the target device due to the effects of low, medium and high powered illumination. These effects would be equivalent to what one would expect from Electromagnetic Interference EMI, RF receiver jamming and a high powered electromagnetic weapon (EMP PULSE weapon) respectively.

In another exemplary embodiment, therein is provided a method of determining and/or characterizing a state and/or an operation of a powered electrical device. The method comprising the steps of (a) collecting, with a first antenna and a receiver coupled to the first antenna, an emission of electromagnetic energy from the electrical device; (b) selecting, with a processor, a spectral target frequency component from a frequency spectrum range of the collected emission, the spectral target frequency component characterized by an amplitude being greater than amplitudes of neighboring spectral frequency components within the collected frequency spectrum range; (c) re-tuning, with the tuner, to a signal based on the specific amplitude of the spectral target frequency component selected in step (b); (d) transmitting, with a second antenna coupled to a RF illumination device, illumination pulse of electromagnetic energy to the electrical device; (e) collecting, with the first antenna and the receiver, a subsequent emission of electromagnetic energy from the electrical device; (f) measuring, with the processor, a change in the amplitude, frequency or shape of the spectral target frequency component in a response to the coupled said illumination signal; (g) correlating, with the processor, the change measured in step (f) with the at least one of the state and the operation of the electrical device; and (h) repeating steps (b) through (e) until the change in the amplitude of the spectral target frequency component is within a preselected amplitude range of the neighboring frequencies, the preselected amplitude range defining a change in state of the device.

In yet a further exemplary embodiment, an automated analysis of RF Effects is controlled by a controller that comprises one or more processors and a non-transitory computer readable medium comprising executable instructions that, when executed by the one or more processors, cause the one or more processors to use characterization feedback so as to select illumination settings in order to identify particularly effective illumination strengths and characteristics. As an example, an optimal illumination strength and frequency may require 10 to 100 times or less power than frequencies above or below that frequency than other illumination strengths and frequencies. The controller controls the sensor RF receiver system and the illumination system consisting of an RF signal generator, pulse generator, and amplifier. The controller further controls collection of the baseline RF signature data, identifies features characterizing an unaffected device, as well as controls the illumination settings and timing, collection of the analysis data from the sensor, and processing the analysis data to identify particularly harmful, useful, or influencing illumination parameters. A Graphical User Interface is also provided and is coupled to the controller.

In another exemplary embodiment using a feedback method, a measurement of responses indicative of device upset, which can also be monitored by visual or electrical means simultaneously can be used recursively as feedback input to determine optimal setting for any given parameter. The optimal setting may typically require far less illumination power and/or pulse duration than power and pulse durations above or below the optimal setting. The automation of this activity with many iterations provides a means to effectively hone in on the parameters to which the target device has susceptibility, either partial or maximum or both.

In yet another exemplary embodiment, a method automates the analysis of the unintended emissions of the device under illumination and illumination parameter response to optimize illumination waveforms transmitted and/or unintended emissions received for maximum RF effects or disruption. Although the exploited phenomenology is quite complex; the system operation is software automated and therefore a strength of the invention is the straight-forward operation. Waveform optimization may include trial and error illumination using modulation envelope shapes such as square, triangle, sawtooth or other commonly known patterns to determine which pattern results in most effective results, for example transmission suppression. The method typically begins with a step of a pre-assessment process which characterizes the emissions of the target device and their relations to emissions measurement parameters of other emissions elements without illumination being present. Upon completion, the method next includes the step of illuminating the target device while simultaneously receiving and analyzing the unintended emissions radiating from the target device. The method also includes the step of dynamically varying an illumination source by a controller over a source parameter space defined by the user. The method then includes a step of associating collected emissions with the applied waveform, processed and routed back to the controller for interpretation. When variations in the unintended emissions of the target device are encountered, the method includes a step of investigating more thoroughly (that is with higher resolution in more detail of the frequency components and more precise dB levels such as analysis steps using smaller incremental trial and error increments of frequency, power, pulse duration or pulse shape) through a refinement in the search space. It is envisioned a non-coherent integration means on the same frequency and illumination settings may be repetitively used to further enhance accurate acquisition and representation of lower level peaks below or close to the noise floor. The method additionally includes a step of searching an entire source parameter space through this process and the step of reporting and/or using all optimized, useful, or discernible RF effects.

In another exemplary embodiment, the operational mode of the target device 410 is changed by means of active illumination.

In another exemplary embodiment, the apparatus 90 determines information from the measured unintended enhanced RF emission from the target device 410 by means of active illumination.

In another exemplary embodiment, the information gathered from collected emissions includes a frequency of a local oscillator of the target device 410.

In another exemplary embodiment, the information gathered from collected emissions includes a harmonic relationship of the unintended emissions of the target device 410.

In another exemplary embodiment, the information gathered from collected emissions includes a frequency of a local oscillator of the target device 410.

In another exemplary embodiment, the automated RF emission measurement iteratively changes its automatically tested configurations.

In another exemplary embodiment, the automated RF emission measurement recursively changes using calculation means its automatically tested configurations to more quickly examine the effects of influencing parameters on the operation of the target device 410.

In another exemplary embodiment, the automated RF emission measurement randomly changes its automatically tested configurations to attempt to find obscure or unexpected effects of influencing parameters on the operation of the target device 410.

In another exemplary embodiment, the automated RF emission measurement heuristically changes its automatically tested configurations to more quickly examine the effects of influencing parameters on the operation of the target device 410.

In another exemplary embodiment, the signature's number of unintended frequency peaks from the target device 410 is changed by means of active illumination.

In another exemplary embodiment, the signature's height of unintended frequency peaks from the target device 410 is changed by means of active illumination.

In another exemplary embodiment, the signature's noise floor 510 of the target device 410 is changed by means of active illumination.

In another exemplary embodiment, at least one of the signature amplitude, signature frequency and signature spacing of unintended frequency peaks from the target device 410 is changed by means of active illumination.

In another exemplary embodiment, a score of disruption is calculated for the target device 410 by means of active illumination.

In another exemplary embodiment, the iteratively changed parameters are increased until a change in the emission signature of the target device 410 is detected by a predefined degree, the parameter setting at the change being the minimum power threshold of change.

In another exemplary embodiment, the minimum power threshold of change of the electromagnetic source's active illumination is determined based on the change in emission signature being detected.

In another exemplary embodiment, the apparatus 90 comprises a receiver 310, wherein the receiver 310 is configured to detect at least one target device 410 by measuring at least one unintended RF emission given off by the at least one target device 410, and an automated controller 100 configured to control the receiver 310 to automatically test receiver configurations of the electromagnetic source to find unintended RF emission frequency candidates which may effect the operation of the target device 410.

In another exemplary embodiment, the apparatus 90 comprises a receiving antenna 320, an RF energy receiver 310, an RF transmitting antenna 240, an illumination device, or RF energy pulse generation source 200, an automatic controller 100 and a computational means, wherein the receiving antenna 320 provides a means to capture electromagnetic energy over the spectrum of interest, wherein the RF energy receiver 310 is connected to the receiving antenna 320 to receive the unintended emissions given off from at least one target device 410, and wherein the RF transmitting antenna 240 is intended to launch electromagnetic energy at the target device 410, RF energy generating source 200 is connected to the transmitting antenna 240 to develop RF launched energy spectrum with the required parameters, an automated control device 100 configured to control one of the electromagnetic source 200 and the receiver 310 to automatically test configurations and one computational means that analyzes the energy received by the RF receiver to determine the impact of an illumination on any parameter of the emission signature of the receiver 310 and correlate it to any parameter of the electromagnetic source to find optimal parameters that effect the susceptibility of the target device 410.

In another exemplary embodiment, the computational means and automated control device are configured through the use of a software routine (executable instructions) to automatically determine and/or optimize at least one of the susceptibility of the target device 410 being illuminated and the target waveform parameters that are capable of causing a desired or required level of disruption.

In another exemplary embodiment, wherein the RF energy receiver 310 and/or controller 100 measures at least one of illumination frequency, multi-frequency, amplitude, modulation, sub-modulation, rise time, fall time, pulse frequency, pulse width, pulse duty cycle, pulse repetition rate, pulse amplitude, pulse duration, pulse repetition pattern, pulse amplitude envelope and pulse frequency envelope and carrier frequency illumination means are varied and emission characteristics at least one of harmonically or non-harmonically related, harmonic series, broadband characteristics, narrow-band characteristics, time domain features, slope, peak skewness, rise-time, noise characteristics, non-linear features, intermodulation features, phase features, and time varying relationships.

In another exemplary embodiment, the automated system iterates changes to the parameters at least one time for optimization.

In one exemplary embodiment, determination of parameters that have an affect on the state of operation of the target device is done by measuring the unintended emissions from the device and varying illumination parameters of an incident electromagnetic wave generator, such as illumination device 200.

In another exemplary embodiment, determination of parameters that have an effect on the state of operation of the target device is done by measuring the unintended emissions from the device and synchronously, independently and/or simultaneously varying illumination parameters of two or more incident electromagnetic wave generators, such as multiple illumination component 200, wherein the multiple illuminations transmitted combine to more effectively affect or inhibit the operation and/or unintended emissions from specific circuitry within the device, such as a device having multiple differing means of network or communication connectivity such as both Ethernet and Wi-Fi each with associated separate circuitry to be influenced. An alternative example would be separate illumination transmissions to separately influence a computer's keyboard and mouse circuitry. A third example would be influencing the networking circuitry while influencing the Disk I/O circuitry to inhibit unnecessary logging of networking errors. A fourth example would be to inhibit both a first Intermediate Frequency (IF) downconverter at a frequency disruptive to it and the second Intermediate Frequency (IF) downconverter at a separate frequency disruptive to it, the second IF being interfaced to the first as is typical in RF receivers, for the purpose of more thoroughly, more probably, more frequency selective, more antenna radio beam propagation focus and angle selective at the different frequency, introducing new modulation patterns into the second IF, and/or more subtly inhibiting receive functionality.

In another exemplary embodiment, waveform parameters, that a specific class of devices may be most susceptible to, are determined.

In yet another exemplary embodiment, an automated tool is provided for characterization of effects of illumination on target device. The target device may include, without limitation, computer, networking device, electronic monitor, telephone, radio receiver, and remotely controlled device that incorporate electrical and/or electronic components.

In a further exemplary embodiment, unintended emissions from the illuminated target device are used in a feedback loop to determine available illumination parameters, based on the physical specifications, that cause the most impact on the target device 410, wherein such impact can be a permanent functional disablement of the target device 410 at the optimal frequency and pulse width settings which require the minimum amount of transmit power so as to avoid damaging or influencing nearby similar devices.

In yet a further exemplary embodiment, an automated method identifies the most effective illumination parameters for influencing and/or disrupting a state and/or operation of the target device. These illumination parameters may be chosen based on the monitored changes on the RF emissions of the target device and indicative of changes in specific operating states of the target device.

In another exemplary embodiment, a method easily and automatically characterizes unique RF emissions of a particular target device. These RF emissions also provide an electronic fingerprint to identify state and/or operation of a target device. Such embodiment may automatically scan the signal output of the target device 410 between 50 MHz and 2000 MHz and locate the 1000 highest peaks emitted from the target device 410 in that range and generate a statistical analysis of their variation in peak dB level and/or vs. frequency location.

In yet another exemplary embodiment, a means iteratively, methodically and automatically to perform all of the above in the most efficient means possible without neglecting any possible illumination characteristic combination which may create a discernable effect. This may be typically be done by interpolatively and/or extrapolatively varying all factors, such as frequency, illumination power level and pulse duration to ensure the optimal settings found are not outside the maximum and minimum frequency, and all illumination power level and pulse durations to a level of quantized resolution are automatically attempted.

In a further exemplary embodiment, the most efficient illumination characteristic combination is found which is either associated with the onset of an unintended effect on the target device or which is associated with the no-longer-invoking-of an unintended effect or the onset of a subsequent unintended effect. As an example, the illumination may be increased in about 1 dB increments or in continuous substantially nonincremental amounts at the optimal frequency until a target device 410 is observed to no longer be transmitting. Then due to an inbuilt unintended hysteresis a reduction of 5 dB may result in resumed operation. Alternatively, a frequency may be chosen to disrupt a keyboard scan circuit, and the keyboard is no longer calculated, assumed or verified to be capable of operation. The illumination frequency or other illumination properties may also be increased in a linear or non-linear continuous substantially nonincremental manner.

In yet a further exemplary embodiment, the target device 410 is illuminated at a single frequency in series such as outputting a fixed power level at 500 MHz, then 501 MHz, incrementing in 1 MHz amounts to 600 MHz while emissions from the target device 410 are monitored at other frequencies over a broad spectrum and parameters variations other than frequency variations are used to determine where the target device 410 is most susceptible based on those parameters alone, those parameters being indicated by such factors as dB sensitivity of a receiver of target device 410 for its receiver receiving digital data with 50% accuracy.

In another exemplary embodiment, the target device 410 is illuminated at multiple frequencies either parallel or in a series with each other, while the emissions from the target device 410 are monitored at frequencies, other than the illumination frequencies over a broad spectrum, and the variation of parameters other than frequency is used to determine where the target device 410 is most affected (ex. what illumination frequency in MHz and pulse duration in milliseconds is most effective in suppressing the operation of the target device 410 operation) by illumination. This can find unintended, unpredictable and/or unexpected relationships in circuitry incidental to the specific design and implementation, such as limitations in combined current draw in a device's circuitry region or limitations in digital ground plane filtering between two adjacent circuits operating outside their expected parameters, causing unexpected interaction or influence between them.

In one exemplary embodiment, the apparatus 90 is configured and operable to determine a state and/or an operation of a powered electrical device. The apparatus comprises a first antenna 320; a receiver 310 coupled to the first antenna 320 and operable to receive emission(s) 420 of electromagnetic energy from the device 410; a second antenna 240; an illumination device 200 coupled to the second antenna 240 so as to illuminate the device 410 with a pulse of electromagnetic energy; a controller 100 including one or more processors 106, a non-transitory computer readable medium 108 comprising executable instructions that, when executed by the one or more processors, cause the one or more processors to perform the steps of selecting a spectral frequency target component of the emission(s), iteratively or recursively controlling the illumination device to illuminate the device 410 with the pulse, measuring, at each iteration, a change in characteristic(s) of the spectral frequency target component of the emission(s), assigning a score value to each measurement, and iteratively effecting optimized parameter(s) of the pulse based on the score value until a final score value indicates a desired state and/or an operation of the device 410.

The chosen exemplary embodiments of the claimed invention have been described and illustrated for practical purposes so as to enable any person skilled in the art to which it pertains to make and use the same. It is therefore intended that all matters in the foregoing description and shown in the accompanying drawings be interpreted as illustrative and not in a limiting sense. It will be understood that variations, modifications, equivalents and substitutions for components of the specifically described exemplary embodiments of the invention may be made by those skilled in the art without departing from the spirit and scope of the invention as set forth in the appended claims.

Any element in a claim that does not explicitly state "means for" performing a specified function, or "step for" performing a specified function, is not to be interpreted as a "means" or "step" clause as specified in 35 U.S.C. § 112, 6. In particular, any use of "step of" in the claims is not intended to invoke the provision of 35 U.S.C. § 112, 6.

Furthermore, the Abstract is not intended to be limiting as to the scope of the claimed invention and is for the purpose of quickly determining the nature of the claimed invention.

What is claimed is:

1. An apparatus that determines a state and/or an operation of a target electrical device, said apparatus comprising:
   an illumination device comprising a housing, a pulse generator, a frequency generator, and an amplifier, said pulse generator, said frequency generator, and said amplifier disposed within said housing;
   a transmit antenna coupled to said amplifier, said transmit antenna transmits electromagnetic energy in a radio frequency (RF) range toward the target electrical device, thereby illuminating the target electrical device with said electromagnetic energy;

a receiver;

a receive antenna positioned remotely from the target electrical device, said receive antenna coupled to said receiver, said receiver in a combination with said receive antenna collects intended or unintended emission from the target electrical device while said target electrical device being illuminated with said electromagnetic energy; and a controller including:

one or more processors, a non-transitory computer readable medium comprising executable instructions that, when executed by said one or more processors, cause said one or more processors to perform the steps of:

selecting a spectral frequency target component of said intended or unintended emission in a selected interval of a wideband emission spectrum, recursively controlling said illumination device to illuminate the target electrical device with said electromagnetic energy, measuring, at each iteration, a change in characteristic(s) of said spectral frequency target component of said intended or unintended emission, assigning a score value to each measurement, and recursively effecting optimized parameter(s) of said electromagnetic energy based on said score value until a final score value indicates a desired state and/or an operation of the target electrical device.

2. The apparatus of claim 1, wherein said transmit antenna is integrated within said housing of said illumination device.

3. The apparatus of claim 1, further comprising a field probe coupled to said controller and being positioned to collect power of said electromagnetic energy illuminating the target electrical device.

4. The apparatus of claim 1, further comprising an auxiliary device operable to control and/or change operation and/or operating environment of the target electrical device.

5. The apparatus of claim 1, further comprising a sensor positioned to sense a change in an operating parameter of the target electrical device.

6. The apparatus of claim 1, wherein said spectral frequency target component comprises a peak.

7. The apparatus of claim 1, wherein the step of recursively controlling said illumination device comprises a step of recursively applying pulse modulation sequences or widths, frequency modulation widths, and/or other modulations or combinations of modulations to find a combination of illumination frequencies, modulations, and power levels which affect the target electrical device.

8. The apparatus of claim 1, wherein said transmit antenna transmits said electromagnetic energy with varying illumination parameters.

9. A method of determining optimal illumination settings to be used by an illumination device to affect at least one of a state and an operation of a target electrical device, said method comprising steps of:

selecting initial illumination parameters for said illumination device;

illuminating, with a transmit antenna coupled to said illumination device, said target electrical device with an electromagnetic energy in a radio frequency (RF) range based on said initial illumination parameters;

collecting, with a receive antenna and a receiver, an RF emission spectrum from said target electrical device;

selecting, with a controller, a new set of illumination parameters based on received emission spectrum; and iteratively repeating illumination of said target electrical device with said new set of illumination parameters, a collection of said emission spectrum and a selection of said new set of illumination parameters until said optimal illumination settings are determined by said controller based on a correlation of an associated disruption effect on said target electrical device.

10. The method of claim 9, wherein the step of selecting said new set of illumination parameters, comprises steps of: measuring, with scoring algorithms executed by a processor within said controller, said collected RF emission spectrum to determine effects of said illumination on said baseline emissions spectrum; selecting, with said processor, illumination parameters resulting in a highest RF emission spectrum score after comparing all spectrum scores; and narrowing or refining illumination parameters.

11. The method of claim 10, wherein the step of narrowing or refining illumination parameters comprises a step of determining a frequency at which said target electrical device responds with reduced correct checksum digital transmission output or a step of suppressing an unintended signal from a local oscillator within said target electrical device.

12. The method of claim 10, wherein the step of narrowing or refining illumination parameters comprises a step of using a binary search or a linear or a non-linear interpolation or a non-linear extrapolation.

13. The method of claim 9, wherein the step of selecting said initial illumination parameters comprises a step of establishing a baseline measurement of an emission spectrum of an electromagnetic energy in said RF range from said target electrical device in a non-illuminated state.

14. The method of claim 9, wherein the step of selecting said initial illumination parameters comprises a step of calculating an initial illumination power output based on a distance between said transmit antenna and said target electrical device and an estimated initial safe non-destructive illumination power desired at said target electrical device.

15. The method of claim 9, wherein the step of establishing said baseline measurement comprises a step of installing said transmit antenna and said receive antenna in an anechoic chamber; a step of collecting a wideband emissions spectrum; a step of selecting features of said wideband emissions spectrum and; and a step of selecting a narrow band spectrum span based on said selected features.

16. The method of claim 9, wherein said illumination parameters comprises one or more of an illumination strength, an illumination frequency, a pulse frequency, a pulse width, a pulse duty cycle, a pulse repetition rate, a pulse shape, and a pulse envelope amplitude.

17. The method of claim 9, wherein selecting said new set of illumination parameters comprises: measuring the unintended emissions from the device; and synchronously, independently and/or simultaneously varying illumination parameters of two or more incident electromagnetic wave generators.

18. The method of claim 17, further comprising affecting or inhibiting operation of and/or unintended emissions from circuits within said target devices.

19. An apparatus that determines a state and/or an operation of a target electrical device, said apparatus comprising:

an illumination device comprising a housing, a pulse generator, a frequency generator, and an amplifier, said pulse generator, said frequency generator, and said amplifier disposed within said housing;
a transmit antenna coupled to said amplifier, said transmit antenna transmits electromagnetic energy in a radio frequency (RF) range toward the target electrical device, thereby illuminating the target electrical device with said electromagnetic energy;
a receiver;
a receive antenna positioned remotely from the target electrical device, said receive antenna coupled to said receiver, said receiver in a combination with said receive antenna collects intended or unintended emission spectrums from the target electrical device while said target electrical device being illuminated with said electromagnetic energy; and
a controller comprising one or more processors and a non-transitory computer readable medium comprising executable instructions that, when executed by said one or more processors, cause said one or more processors to iteratively or recursively optimize parameters of said transmitted electromagnetic energy until a final score value of said collected intended or unintended emission spectrums indicates a desired state and/or an operation of the target electrical device.

20. The apparatus of claim 19, wherein said computer readable medium comprises a spectrum characterization module, a spectrum scoring module, and an illumination control module.

21. The apparatus of claim 20, wherein said spectrum characterization module comprises:
a signature identification tool that causes said one or more processors to analyze an emission spectrum without active illumination to identify features unique to said target electrical device;
a correlation tool that causes said one or more processors to determine relationships between multiple features identified within said emission spectrum; and
a monitored frequency selection tool that causes said one or more processors to select narrowband frequency spans.

22. The apparatus of claim 20, wherein said spectrum scoring module comprises:
a signature identification tool that causes said one or more processors to analyze said intended or unintended emission spectrums during illumination and to identify features in said intended or unintended emission spectrums;
a signature scoring tool that causes said one or more processors to assign a score to each intended or unintended emission spectrum collected during said illumination; and
a baseline comparison tool that causes said one or more processors to compare each score to a baseline measurement so as to measure a degree of degradation or a change of said each emission spectrum and thereby measure a degradation or a change of the state and/or operation of the target electrical device.

23. The apparatus of claim 20, wherein said illumination control module comprises:
a pulse generator control tool;
a signal generator control tool; and
an illumination power tool.

24. A method of finding unintended, unpredictable and/or unexpected relationships in a circuitry of operating target electrical device, said method comprising steps of: illuminating said target electrical device with multiple frequencies either parallel or in a series with each other; monitoring resulting electromagnetic emissions in a radio frequency (RF) range from said target electrical device at frequencies being different from said illumination frequencies; and determining, based on a variation of parameters other than a frequency parameter, effect of said illumination on an operation of said operating target electrical device.

25. An apparatus that determines a state and/or an operation of a target electrical device, said apparatus comprising:
an illumination device;
a transmit antenna coupled to said illumination device, said transmit antenna transmits electromagnetic energy in a radio frequency (RF) range toward the target electrical device, thereby illuminating the target electrical device with said electromagnetic energy;
a receiver;
a receive antenna positioned remotely from the target electrical device, said receive antenna coupled to said receiver, said receiver in a combination with said receive antenna collects intended or unintended emission spectrums from the target electrical device while said target electrical device being illuminated with said electromagnetic energy; and
a controller comprising one or more processors and a non-transitory computer readable medium, said non-transitory computer readable medium comprising a spectrum characterization module, a spectrum scoring module, and an illumination control module, said spectrum characterization module comprising:
a signature identification tool comprising executable instructions that, when executed by said one or more processors, causes said one or more processors to analyze an emission spectrum without active illumination to identify features unique to said target electrical device,
a correlation tool executable instructions that, when executed by said one or more processors, causes said one or more processors to determine relationships between multiple features identified within said emission spectrum, and
a monitored frequency selection tool comprising executable instructions that, when executed by said one or more processors, causes said one or more processors to select narrowband frequency spans;
said controller configured to iteratively or recursively optimize parameters of said transmitted electromagnetic energy until a final score value of said collected intended or unintended emission spectrums indicates a desired state and/or an operation of the target electrical device.

26. An apparatus that determines a state and/or an operation of a target electrical device, said apparatus comprising:
an illumination device;
a transmit antenna coupled to said illumination device, said transmit antenna transmits electromagnetic energy in a radio frequency (RF) range toward the target electrical device, thereby illuminating the target electrical device with said electromagnetic energy;
a receiver;
a receive antenna positioned remotely from the target electrical device, said receive antenna coupled to said receiver, said receiver in a combination with said receive antenna collects intended or unintended emission spectrums from the target electrical device while said target electrical device being illuminated with said electromagnetic energy; and
a controller comprising one or more processors and a non-transitory computer readable medium, said non-transitory computer readable medium comprising a spectrum characterization module, a spectrum scoring module, and an illumination control module, said spectrum scoring module comprises:
   a signature identification tool comprising executable instructions that, when executed by said one or more processors, causes said one or more processors to analyze said intended or unintended emission spectrums during illumination and to identify features in said intended or unintended emission spectrums,
   a signature scoring tool comprising executable instructions that, when executed by said one or more processors, causes said one or more processors to assign a score to each intended or unintended emission spectrum collected during said illumination, and
   a baseline comparison tool comprising executable instructions that, when executed by said one or more processors, causes said one or more processors to compare each score to a baseline measurement so as to measure a degree of degradation or a change of said each emission spectrum and thereby measure a degradation or a change of the state and/or operation of the target electrical device;
   said controller configured to iteratively or recursively optimize parameters of said transmitted electromagnetic energy until a final score value of said collected intended or unintended emission spectrums indicates a desired state and/or an operation of the target electrical device.

27. An apparatus that determines a state and/or an operation of a target electrical device, said apparatus comprising:
   an illumination device;
   a transmit antenna coupled to said illumination device, said transmit antenna transmits electromagnetic energy in a radio frequency (RF) range toward the target electrical device, thereby illuminating the target electrical device with said electromagnetic energy;
   a receiver;
   a receive antenna positioned remotely from the target electrical device, said receive antenna coupled to said receiver, said receiver in a combination with said receive antenna collects intended or unintended emission from the target electrical device while said target electrical device being illuminated with said electromagnetic energy; and
   a controller including:
   one or more processors,
   a non-transitory computer readable medium comprising executable instructions that, when executed by said one or more processors, cause said one or more processors to perform the steps of:
   selecting a spectral frequency target component of said intended or unintended emission in a selected interval of a wideband emission spectrum,
   recursively controlling said illumination device to illuminate the target electrical device with said electromagnetic energy,
   measuring, at each iteration, a change in characteristic(s) of said spectral frequency target component of said intended or unintended emission,
   assigning a score value to each measurement, and
   recursively effecting optimized parameter(s) of said electromagnetic energy based on said score value until a final score value indicates a desired state and/or an operation of the target electrical device.

* * * * *